(12) United States Patent
Kawai

(10) Patent No.: US 6,411,554 B1
(45) Date of Patent: Jun. 25, 2002

(54) HIGH VOLTAGE SWITCH CIRCUIT HAVING TRANSISTORS AND SEMICONDUCTOR MEMORY DEVICE PROVIDED WITH THE SAME

(75) Inventor: Shinji Kawai, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/710,909

(22) Filed: Nov. 14, 2000

(30) Foreign Application Priority Data

May 12, 2000 (JP) .................................... 2000-140357

(51) Int. Cl.[7] .................................................. G11C 7/00
(52) U.S. Cl. ............................ 365/189.09; 365/189.11; 365/226; 326/68; 327/55
(58) Field of Search ..................... 365/189.11, 189.01, 365/189.08, 189.09, 205, 208, 226, 156; 327/55, 215, 434; 326/68, 81

(56) References Cited

U.S. PATENT DOCUMENTS

| | | | | |
|---|---|---|---|---|
| 5,243,236 A | * | 9/1993 | McDaniel | 326/68 |
| 5,399,928 A | * | 3/1995 | Lin et al. | 327/434 |
| 5,406,141 A | * | 4/1995 | Yero et al. | 326/68 |
| 5,736,869 A | * | 4/1998 | Wei | 326/81 |
| 5,867,042 A | * | 2/1999 | Briner | 327/55 |
| 5,872,476 A | * | 2/1999 | Mihara et al. | 327/333 |

FOREIGN PATENT DOCUMENTS

JP 9-261037 10/1997

* cited by examiner

*Primary Examiner*—David Nelms
*Assistant Examiner*—Gene N. Auduong
(74) *Attorney, Agent, or Firm*—McDermott, Will & Emery

(57) ABSTRACT

A high voltage switch circuit according to the present invention includes PMOS transistors having one conductive terminals receiving a high voltage, NMOS transistors having one conductive terminals receiving a ground voltage, and transistors for voltage control. The transistors for voltage control have their gates supplied with gate control signals of which potential change in accordance with the level of the high voltage. Thus, a high voltage switch circuit which can normally operate independent of the voltage level can be provided.

11 Claims, 20 Drawing Sheets

HIGH VOLTAGE SWITCH CIRCUIT HAVING TRANSISTORS AND SEMICONDUCTOR MEMORY DEVICE PROVIDED WITH THE SAME

BACKGROUND OF THE INVENTION

1. Field of the Invention

The present invention relates to a high voltage switch circuit and a semiconductor memory device provided with the same and, more particularly to a structure performing voltage control and ensuring a normal switching operation.

2. Description of the Background Art

Conventionally, a high voltage switch circuit has been used as a circuit for converting the amplitude level of an input signal. The high voltage switch circuit converts an input signal (amplitude level VCC–GND) switching between a power supply voltage level VCC and a ground voltage level GND to a signal (amplitude level VPP–GND) switching between a positive high voltage level VPP and a ground voltage level GND or to a signal (amplitude level VN–VCC) switching between a negative high voltage level VN and power supply voltage level VCC (|VN|>VCC).

The high voltage switch circuit includes a transistor (a switching transistor) for switching and a transistor for voltage control. A high voltage is applied between the source and drain of the switching transistor during the switching operation, during which hot carriers are generated to cause degradation of the current value or threshold value of the transistor. Thus, a normal operation of the circuit cannot be ensured. Accordingly, the transistor for voltage control is arranged to control the voltage of the transistor.

Such a high voltage switch circuit is used for controlling data writing, reading, erasing and the like, with respect to a memory cell of the semiconductor memory device.

However, in the conventional high voltage switch circuit, a gate voltage of the transistor for voltage control is fixed at a prescribed value (at power supply voltage VCC when switching at high voltage VPP and at ground voltage GND when switching at high voltage VN).

Thus, the conventional structure suffers from a problem that the circuit cannot operate if the switching high voltage is close to power supply voltage VCC or ground voltage GND. In addition, in the semiconductor memory device, a memory operation must be controlled by using a high voltage switch circuit ensuring a normal switching operation and optimum voltage control.

SUMMARY OF THE INVENTION

Therefore, the present invention provides a high voltage switch circuit ensuring a normal switching operation and optimum voltage control as well as a semiconductor memory device provided with the same.

A high voltage switch circuit according to one aspect of the present invention includes: a first power supply node capable of supplying a high voltage greater in absolute value than a power supply voltage; a second power supply node to supply a voltage at most the power supply voltage; a first transistor converting the voltage level of an input signal in accordance with the input signal and the voltage supplied from the first power supply node; a second transistor converting the voltage level of an input signal in accordance with the input signal and the voltage supplied from the second power supply node; a switch circuit switching the amplitude level of an input signal between the power supply voltage level and the ground voltage level; and a third transistor connected between the first and second transistors and having its gate voltage controlled.

Preferably, the third transistor operates such that the drain-source voltage of the first or second transistors is controlled.

More preferably, the gate voltage of the third transistor is switched by a control signal for making the first power supply node attain to a high voltage.

Preferably, the voltage of the first power supply node attains to a high voltage when a first period of time is elapsed after it is at a power supply voltage. The gate voltage of the third transistor is switched by a signal activated when a second period of time shorter than the first period of time is elapsed after the voltage of the first power supply node begins to change.

Preferably, the gate voltage of the third transistor is switched by a signal activated when the voltage of the first power supply node attains to a prescribed level.

Preferably, the gate voltage of the third transistor is controlled by a control signal at a voltage level which is less dependent on the power supply voltage. It is noted that the above mentioned voltage may arbitrarily be changed.

Preferably, the gate of the third transistor is controlled by a bias voltage allowing a constant current which does not depend on the high voltage.

Thus, according to the above described high voltage switch circuit, the gate voltage of the transistor for voltage control can be controlled. Accordingly, the voltage of the transistor is controlled when the voltage of the power supply node attains to a desired high voltage level. In addition, a normal operation is ensured even if the power supply node is at the low voltage level.

Particularly, the gate voltage of the transistor for voltage control can be controlled by a control signal for making the voltage level of the power supply node attain to the high voltage level.

Particularly, the gate voltage of the transistor for voltage control can be controlled by a signal activated when the voltage level of the power supply node increases or decreases.

Particularly, the gate voltage of the transistor for voltage control can be controlled by a signal activated when the voltage of the power supply node attains to a desired level.

Particularly, the gate voltage of the transistor for voltage control can be controlled by a signal which is not dependent or less dependent on the power supply voltage.

Thus, optimum voltage control is achieved without stopping the operation of the circuit.

A semiconductor memory device according to another aspect of the present invention includes: a memory cell array including a plurality of memory cells; a control circuit for controlling the operation of the memory cell array; a circuit generating an operation signal for operating the memory cell array under control of the control circuit; a generation circuit outputting a power supply voltage in a stand-by mode and activated during the operation of the memory cell array for generating a high voltage greater in absolute value than the power supply voltage; and a high voltage switch circuit switching the amplitude level of the operation signal. The high voltage switch circuit includes: a first power supply node receiving a voltage output from the generation circuit; a second power supply node supplied with a voltage at most the power supply voltage; a first transistor converting the voltage level of the operation signal in accordance with the operation signal and the voltage supplied from the first power supply node; a second transistor converting the voltage level of the operation signal in accordance with the operation signal and the voltage supplied from the second power supply node; a switch circuit switching the amplitude level of the operation signal; and a third transistor connected between the first and second transistors and having its gate voltage controlled.

Preferably, the third transistor operates such that a drain-source voltage of the first or second transistors is controlled.

More preferably, the control circuit includes a circuit generating a control signal for activating the generation circuit, and the gate voltage of the third transistor is switched by the control signal.

More preferably, the control circuit includes a circuit generating a control signal for activating the generation circuit and a delay circuit for delaying the control signal by a prescribed period of time for output. The gate voltage of the third transistor is switched by an output from the delay circuit.

More preferably, the control circuit includes a circuit generating a control signal for activating the generation circuit and a circuit generating a detection signal which is activated when an output from the generation circuit attains to a prescribed level. The gate voltage of the third transistor is switched by the detection signal.

More preferably, the operation signal switches between the power supply voltage and the ground voltage. The control circuit includes a signal generation circuit generating a control signal at a voltage level which is less dependent on the power supply voltage. The gate voltage of the third transistor is switched by the control signal. It is noted that the above defined voltage may arbitrarily be changed by the signal generation circuit.

More preferably, the operation signal switches between the power supply voltage and the ground voltage. The control circuit includes a circuit generating a bias voltage to be supplied to the gate of the third transistor such that a constant current, which is not dependent on the high voltage, flows to the third transistor.

Thus, according to the above described semiconductor memory device, the gate voltage of the transistor for voltage control can be controlled in the high voltage switch circuit switching the voltage level of the operation signal for the memory operation. Accordingly, voltage control is achieved in accordance with the memory operation, thereby enabling a normal operation if the memory operation is performed or not.

Particularly, the gate voltage of the transistor for voltage control can be controlled by a control signal activating the circuit generating the high voltage.

Particularly, the gate voltage of the transistor for voltage control can be controlled by a signal obtained by delaying the control signal activating the circuit generating the high voltage.

Particularly, the gate voltage of the transistor for voltage control can be controlled by a signal activated when the voltage output from the circuit generating the high voltage during the operation of the memory cell array attains to a prescribed level.

Particularly, the gate voltage of the transistor for voltage control can be controlled by a signal at a voltage level which is not dependent or less dependent on the power supply voltage.

Therefore, according to the semiconductor memory device of the present invention, a normal operation and voltage control of the high voltage switch circuit are ensured, so that an accurate operation is ensured.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
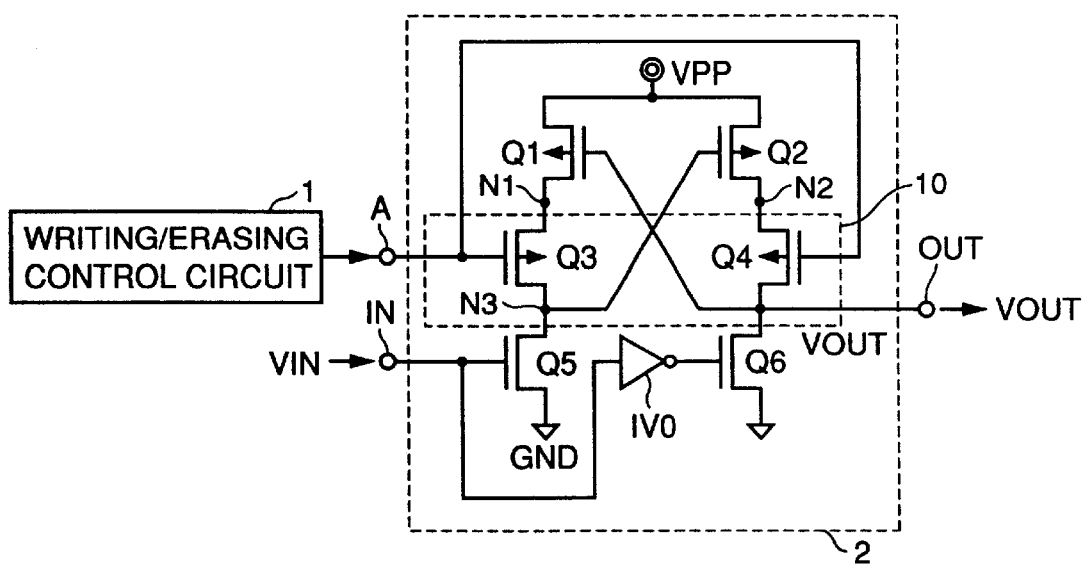
FIG. 1 is a diagram shown in conjunction with a high voltage switch circuit 2 according to the first embodiment of the present invention.

Now, the embodiments of the present invention will be described in detail with reference to the drawings. The same or corresponding portions are denoted by the same reference characters and numerals throughout the drawings, and therefore the description thereof will not be repeated.

First Embodiment

A high voltage switch circuit and a semiconductor memory device provided with the same according to the first embodiment will be described. A high voltage switch circuit 2 according to the first embodiment converts an input signal VIN (amplitude VCC–GND) to a signal VOUT (amplitude VPP–GND) and, as shown in FIG. 1, includes transistors Q1 to Q6 as well as an inverter IV0. Transistors Q1 to Q4 are PMOS transistors, whereas transistors Q5 and Q6 are NMOS transistors.

High voltage switch circuit 2 receives input signal VIN from a signal input node IN and receives a gate control signal A controlling the gate voltage of a transistor for voltage control from a control signal input node A for outputting a signal VOUT from an output node OUT.

Transistor Q5 is connected between a node N3 and a node GND receiving a ground voltage GND and has its gate receiving input signal VIN. Inverter IV0 inverts and outputs input signal VIN. Transistor Q6 is connected between nodes OUT and GND and has its gate receiving an output from inverter IV0.

Transistor Q3 is connected between nodes N1 and N3, whereas transistor Q4 is connected between nodes N2 and OUT.

Transistor Q1 is connected between a node VPP receiving a high voltage and node N1 and has its gate connected to node OUT. Transistor Q2 is connected between nodes VPP and N2 and has its gate connected to node N3.

Transistors Q3 and Q4 are transistors for voltage control and form a voltage control circuit 10 for controlling the gate voltage of the transistor of the circuit. Unlike the conventional case, the gates of transistors for voltage control Q3 and Q4 are not supplied with a prescribed voltage, but receive externally input gate control signal A.

When high voltage switch circuit 2 is included in the semiconductor memory device, the potential of gate control signal A is controlled by a writing/erasing control circuit 1 for controlling writing/erasing with respect to the memory cell.

Figure 2:
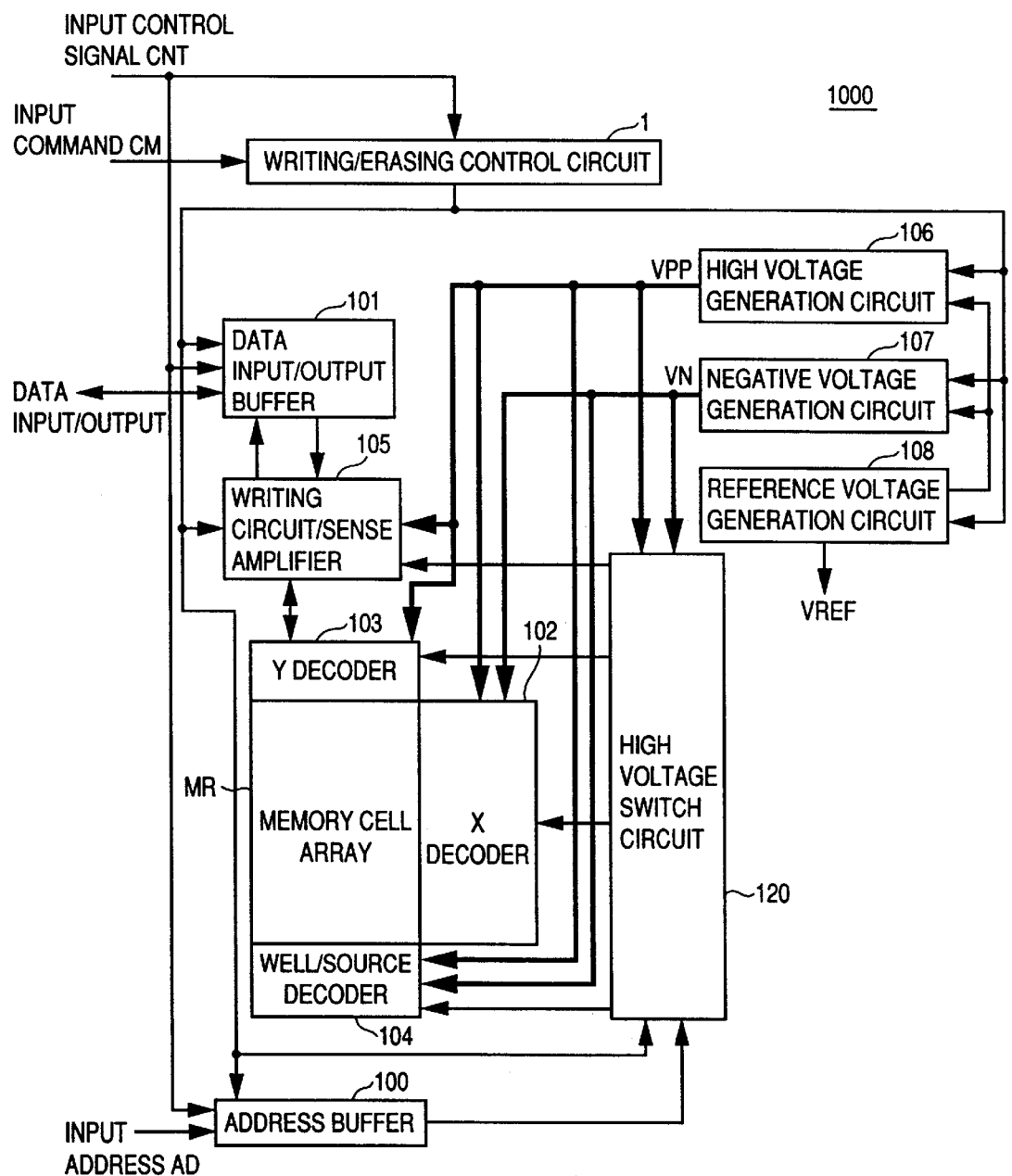
FIG. 2 is a diagram schematically showing an overall arrangement of a semiconductor memory device 1000 including high voltage switch circuit 2 according to the first embodiment.

A semiconductor memory device 1000 including high voltage switch circuit 2 will be described with reference to FIG. 2. Referring to FIG. 2, semiconductor memory device 1000 includes: a writing/erasing control circuit 1; an address buffer 100 externally receiving an address AD; a data input/output buffer 101 for inputting/outputting data; a memory cell array MR including a plurality of memory cells arranged in a matrix; an X decoder 102 and Y-decoder 103 for selecting an arbitrary memory cell from memory cell array MR; a well/source decoder 104 for driving well and source voltages for data writing/erasing/reading with respect to the memory cell; a sense amplifier for reading data from the memory cell; and a writing circuit for writing data. In the drawing, the sense amplifier and writing circuit are collectively depicted as a single block 105.

Writing/erasing control circuit 1 controls the operation of an internal circuit by an input of a control signal CNT (a chip enable signal, write enable signal and the like) received from the external portion of the chip and a dedicated data input referred to as a command CM. It is noted that dedicated command CM is determined for every chip operation such as writing/erasing/reading operation.

Semiconductor memory device 1000 further includes: a high voltage generation circuit 106 boosting power supply voltage VCC for generating positive high voltage VPP; a negative high voltage generation circuit 107 down-converting a ground voltage GND for generating a negative high voltage VN; a reference voltage generation circuit 108 generating a reference voltage VREF used for control of the voltage level; and a high voltage switch circuit 120 converting and outputting the amplitude level of a signal (input signal VIN) received from address buffer 100 in accordance with a signal from writing/erasing control circuit 1.

High voltage VPP and negative high voltage VN respectively output from high voltage generation circuit 106 and negative high voltage generation circuit 107 are used for data writing/erasing/reading with respect to the memory cell.

High voltage switching circuit 120 converts and outputs the amplitude level of input signal VIN from a level between VCC and GND to that between VPP and GND or between VCC and VN for controlling a circuit (X decoder 102, Y decoder 103, well/source decoder 104) to which a high voltage is applied during the writing/erasing/reading operation. The above mentioned high voltage switch circuit 2 is included in high voltage switch circuit 120.

When command CM designating the specific operation is input, writing/erasing control circuit 1 outputs a prescribed control signal. High voltage generation circuit 106, negative high voltage generation circuit 107 and reference voltage generation circuit 108 are activated/inactivated under control of writing/erasing control circuit 1.

When high voltage generation circuit 106 is activated, the voltage output from high voltage generation circuit 106 attains to a prescribed high voltage level VPP from power supply voltage level VCC. When negative high voltage generation circuit 107 is activated, the voltage output from negative high voltage generation circuit 107 attains to a prescribed negative high voltage level VN from ground voltage level GND.

It is noted that high voltage generation circuit 106 and negative high voltage generation circuit 107 are independently controlled by writing/erasing control circuit 1. Accordingly, activation/inactivation timings of high voltage generation circuit 106 and negative high voltage generation circuit 107 are independent of each other. It is noted that high voltage switch circuit 2 receives an output from high voltage generation circuit 106 at node VPP.

Next, a control method for high voltage switch circuit 2 according to the first embodiment will be described. First, for the purpose of comparison, high voltage switch circuit 900 of which method of controlling the transistor for voltage control is different from that of high voltage switch circuit 2 will be described.

Figure 30:
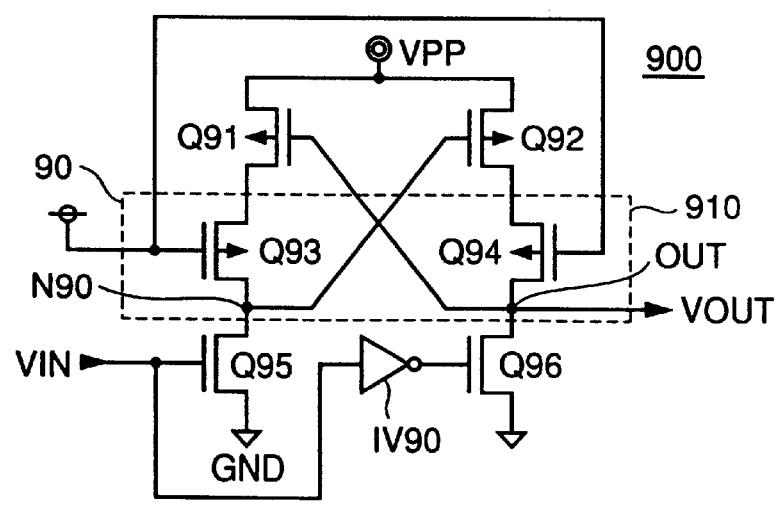
FIG. 30 is a circuit diagram exemplifying a high voltage switch circuit 900 including a voltage control circuit.

High voltage switch circuit 900 shown in FIG. 30 converts input signal VIN (amplitude VCC–GND) to signal VOUT (amplitude VPP–GND) and includes transistors Q91 to Q96 as well as an inverter IV90. Transistors Q91 to Q94 are PMOS transistors, whereas transistors Q95 and Q96 are NMOS transistors.

Transistor Q95 is connected between a node N90 and a node GND receiving a ground voltage GND and has its gate receiving input signal VIN. Inverter IV90 inverts and outputs input signal VIN. Transistor Q96 is connected between a node OUT, that is an output node of the circuit, and node GND, and has its gate receiving an output from inverter IV90.

Transistor Q93 is connected between transistor Q91 and node N90, whereas transistor Q94 is connected between transistor Q92 and node OUT. Transistors Q93 and Q94 have their gates receiving power supply voltage One conductive terminals of transistors Q91 and Q92 are connected to node VPP receiving positive high voltage VPP, and transistors Q91 and Q92 have their gates respectively connected to node OUT and node N90.

Transistors Q93 and Q94 (transistors for voltage control) form a voltage control circuit 910. Voltage control circuit 910 controls the source-drain voltage of the transistors when switching to the high voltage.

High voltage switch circuit 900 converts input signal VIN (amplitude level VCC–GND) to signal VOUT (amplitude level VPP–GND).

However, the gate voltage of the transistor for voltage control is fixed at a prescribed voltage (power supply voltage VCC). Accordingly, the circuit operation is not ensured if the high voltage to be switched is close to power supply voltage VCC or ground voltage GND.

On the other hand, in the first embodiment, gate control signal A controlling the gate of the transistor for voltage control is changed in accordance with the level of the voltage to be applied to node VPP of high voltage switch circuit 2.

Figure 3:
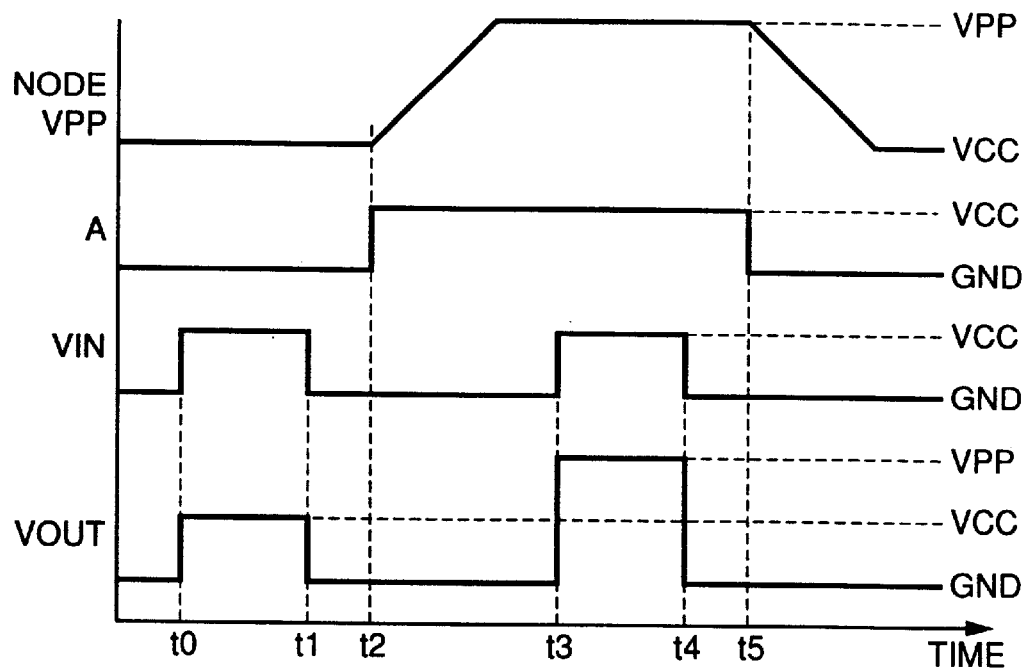
FIG. 3 is a timing chart shown in conjunction with a control method for high voltage switch circuit 2 according to the first embodiment.

Referring to FIG. 3, assume that high voltage switch circuit 2 receives input signal VIN at power supply voltage level VCC during times t0 to t1 and t3 to t4. In addition, power supply voltage VCC is applied to node VPP in an initial state.

Gate control signal A is at ground voltage level GND when power supply voltage VCC is applied to node VPP (up to t2). Accordingly, input signal VIN received from time t0 to t1 is converted to signal VOUT at power supply voltage level VCC for output.

When application of the high voltage to node VPP is started (time t2), gate control signal A is switched to attain from ground voltage level GND to power supply voltage level VCC.

Thus, voltage control is performed, and input signal VIN received between times t3 and t4 is converted to signal VOUT at high voltage level VPP for output.

Then, when the level of the voltage applied to node VPP is down-converted (when application of the high voltage is finished) (time t5), the level of gate control signal A is switched from power supply voltage level VCC to ground voltage level GND.

Figure 4:
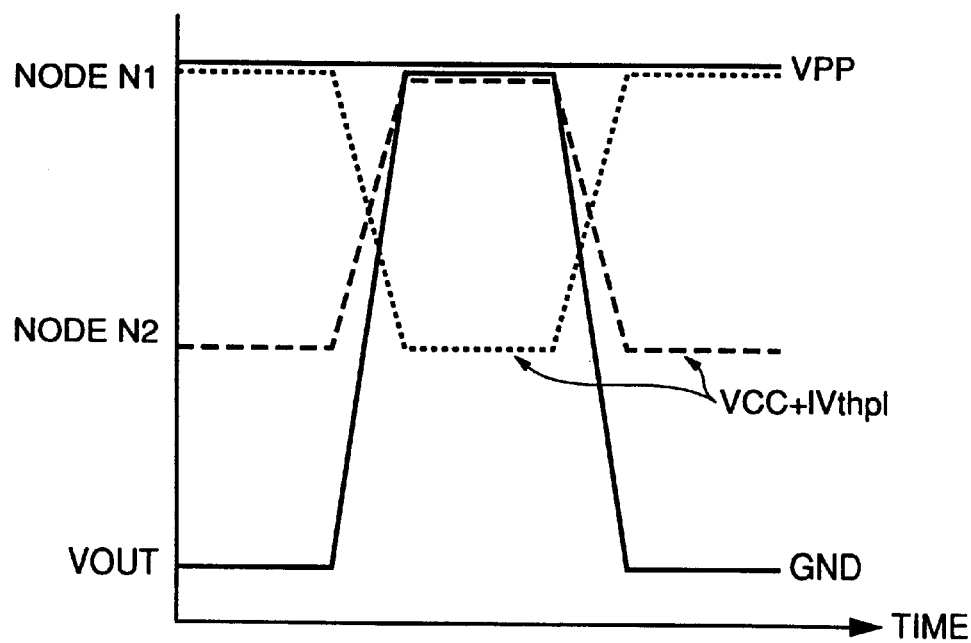
FIG. 4 is a timing chart shown in conjunction with voltage control in high voltage switch circuit 2 according to the first embodiment.

In such a control method, the voltage levels of internal nodes N1 and N2 in high voltage switch circuit 2 are changed as shown in FIG. 4 when switching to the high voltage. Referring to FIG. 4, the source-drain voltages are controlled to {VPP−(VCC+|Vthp|)} and (VCC+|Vthp|) respectively for transistors Q1, Q2 and Q3, Q4. Here, Vthp represents the threshold value of transistors Q3 and Q4.

When application of the high voltage to node VPP is finished or when power supply voltage VCC is applied without application of the high voltage, the level of the gate of the transistor for voltage control is changed from power supply voltage level VCC to ground voltage level GND or fixed at ground voltage level GND. Thus, high voltage switch circuit 2 can normally operate even when the voltage applied to node VPP is low.

The control method as applied to semiconductor memory device 1000 will be described. When the high voltage is not required, writings/erasing control circuit 1 outputs gate control signal A at ground voltage level GND. At this point of time, high voltage generation circuit 106 is in an inactive state.

When command CM designating a specific operation is input to writing/erasing control circuit 1, gate control signal A at power supply voltage level VCC is output from writing/erasing control circuit 1, so that high voltage generation circuit 106 is activated.

Then, when application of the high voltage is finished, the level of gate control signal A is switched to ground voltage level GND to inactivate high voltage generation circuit 106. The level of the voltage applied to node VPP is decreased to attain to power supply voltage level VCC. Such a control method ensures correct writing/erasing/reading operation of semiconductor memory device 1000.

It is noted that a signal directly controlling activation/inactivation of high voltage generation circuit 106 may be used as gate control signal A.

Figure 5:
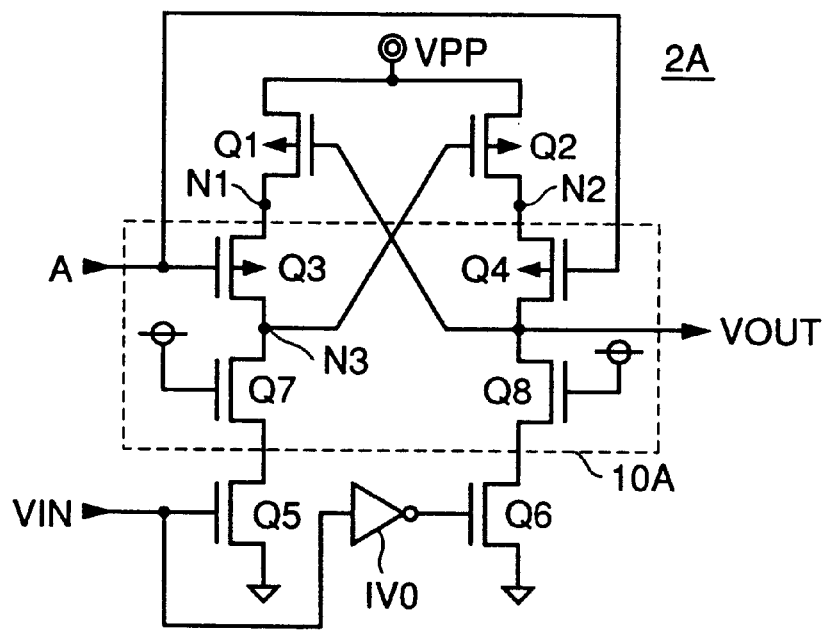
FIGS. 5 and 6 are circuit diagrams respectively showing structures of high voltage switch circuits 2A and 2B.

It is noted that the structure of the high voltage switch circuit applied to the present invention is not limited to that shown in FIG. 1. Another exemplary structure of the high voltage switch circuit is shown in FIG. 5. A high voltage switch circuit 2A shown in FIG. 5 includes transistors Q1, Q2, Q5 and Q6, a voltage control circuit 10A having transistors Q3, Q4, Q7 and Q8, as well as an inverter IV0. Transistors Q7 and Q8 are NMOS transistors.

In high voltage switch circuit 2A, transistors Q3, Q4, Q7 and Q8 function as transistors for voltage control.

Transistor Q7 is connected between transistors Q3 and Q5, whereas transistor Q8 is connected between transistors Q4 and Q6. Each of transistors Q7 and Q8 has its gate receiving a power supply voltage.

Figure 6:
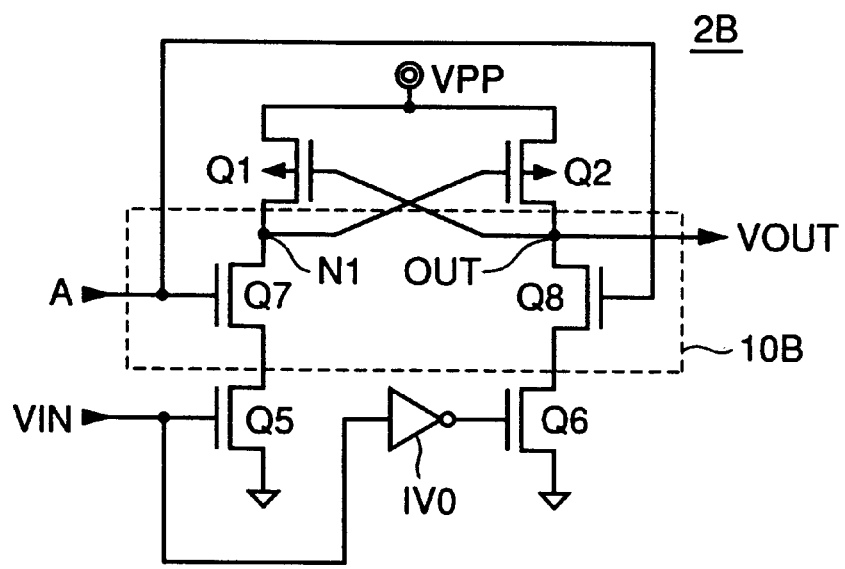

Another exemplary structure of the high voltage switch circuit is shown in FIG. 6. A high voltage switch circuit 2B shown in FIG. 6 includes transistors Q1, Q2, Q5 and Q6, a voltage control circuit 10B having transistors Q7 and Q8, as well as an inverter IV0. In high voltage switch circuit 2B, transistors Q7 and Q8 function as transistors for voltage control.

Transistor Q1 is connected between nodes VPP and N1 and have its gate receiving a signal VOUT of node OUT. Transistor Q2 is connected between nodes VPP and OUT and has its gate receiving a signal of node N1.

Transistor Q7 is connected between node N1 and transistor Q5, whereas transistor Q8 is connected between node OUT and transistor Q6. Transistors Q7 and Q8 have their gates receiving gate control signals A.

It is noted that although the circuit structure for converting input signal VIN to signal VOUT at amplitude level VPP–GND has been described above, such a control method can also be applied to a circuit for converting input signal VIN to signal VOUT at amplitude level VN–VCC (VN: a negative high voltage). In this case, as will later be described, a gate control signal applied to the gate of the transistor for voltage control is changed in accordance with the voltage level at node VN receiving negative high voltage VN. Thus, a normal operation is ensured even when the voltage level at node VN is around ground voltage level GND.

Second Embodiment

Figure 7:
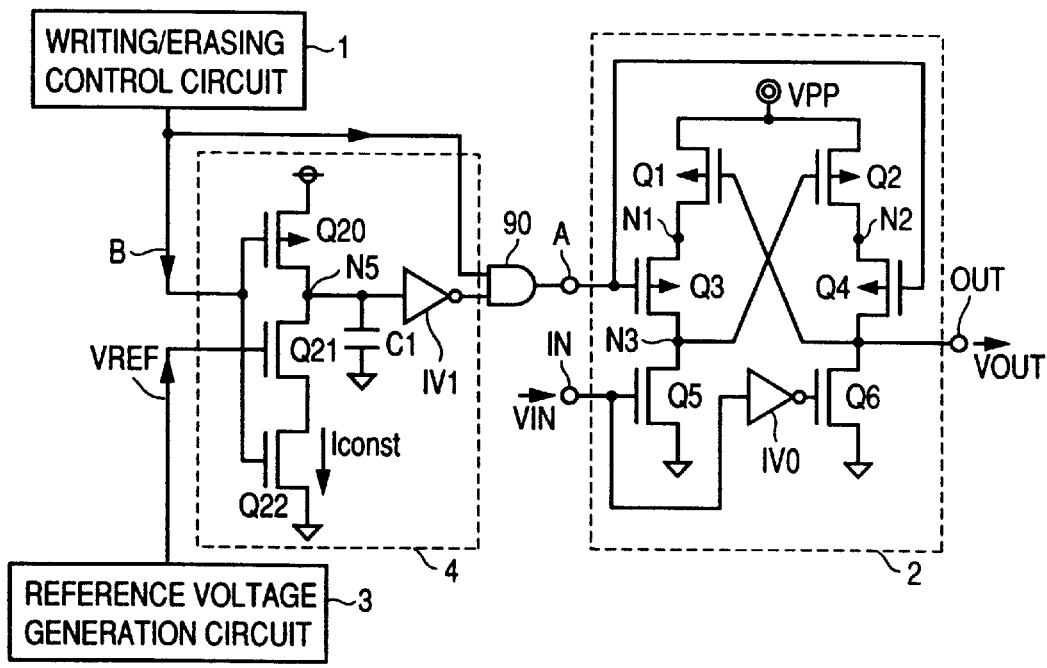
FIG. 7 is a diagram shown in conjunction with control of a high voltage switch circuit 2 according to the second embodiment.

A high voltage switch circuit according to the second embodiment will be described. As shown in FIG. 7, a high voltage switch circuit 2 according to the second embodiment has transistors Q3 and Q4 that have their gates receiving gate control signals A output from an AND circuit 90.

AND circuit 90 has its input receiving a control signal B output from a writing/erasing control circuit 1 and an output from a timer circuit 4. Timer circuit 4 outputs a signal at an H level when a prescribed period of time is elapsed after control signal B at the H level is received from writing/erasing control circuit 1.

Timer circuit 4 will be described. Timer circuit 4 includes transistors Q20 to Q22, a capacitor C1, and an inverter IV1. Transistor Q20 is a PMOS transistor, whereas transistors Q21 and Q22 are NMOS transistors.

Transistor Q20 is connected between a node receiving a power supply voltage and a node N5, whereas transistors Q21 and Q22 are connected in series between node N5 and a node GND receiving a ground voltage GND. Transistors Q20, Q22 and transistor Q21 have their gates receiving control signal B and a reference voltage VREF output from a reference voltage generation circuit 3, respectively.

Capacitor C1 is connected between nodes N5 and GND, and inverter IV1 inverts a signal of node N5 for output.

AND circuit 90 has its input receiving an output from inverter IV1 and control signal B for outputting a gate control signal A.

Figure 8:
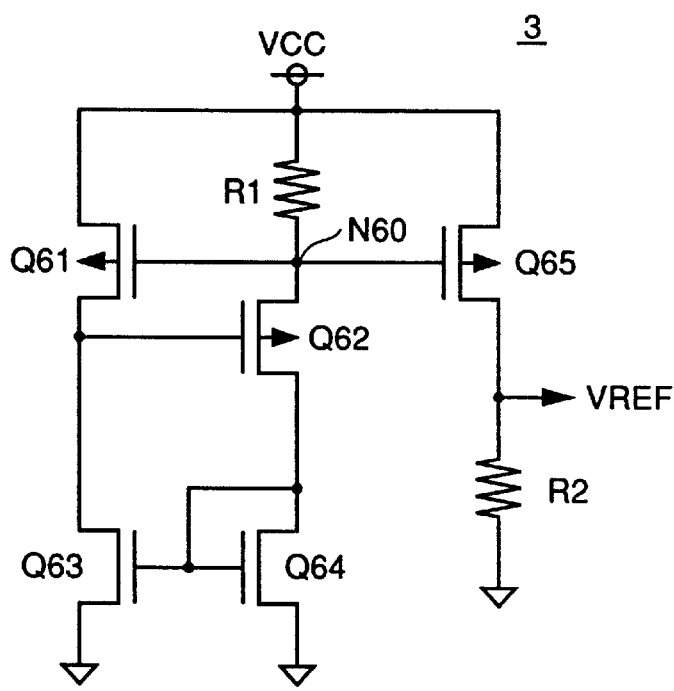
FIG. 8 is a circuit diagram exemplifying the structure of a reference voltage generation circuit 3.

Reference voltage generation circuit 3 includes transistors Q61 to Q65 and resistors R1 and R2, as shown in FIG. 8. Transistors Q61, Q62, and Q65 are PMOS transistors, whereas transistors Q63 and Q64 are NMOS transistors.

Resistor R1 is connected between a node VCC receiving power supply voltage VCC and a node N60. Transistors Q61 and Q63 are connected in series between node VCC and node GND receiving ground voltage GND. Transistors 62 and 64 are connected in series between nodes N60 and GND. Transistors Q63 and Q64 form a current mirror circuit.

Transistor Q65 and resistor R2 are connected in series between nodes VCC and GND, and a reference voltage VREF is output from a connection node of transistor Q65 and resistor R2.

Reference voltage VREF will be described. The same current is supplied to transistor Q61 and resistor R1 because of transistors Q63 and Q64 (a current mirror circuit). If a conductance and threshold value of transistor Q61 are respectively $\beta1$ and VthQ1, a current IR1 flowing through resistor R1 satisfies the following equation (1). Assume that resistance values of resistors R1 and R2 are respectively R1 and R2.

$$IR1 = VthQ1 + \sqrt{(2I/\beta1)} \tag{1}$$

$$I = VthQ1/R1 \tag{2}$$

It is noted that, in the above equation (1), $\sqrt{(2I/\beta1)}$ is extremely small, so that the following equation (3) is obtained.

$$IR1 = VthQ1 \tag{3}$$

Accordingly, reference voltage VREF satisfying the following equation (4) is to be output.

$$VREF = VthQ1 \times (R2/R1) \tag{4}$$

Next, a control method for high voltage switch circuit 2 according to the second embodiment will be described. Control signal B is changed in accordance with the level of the voltage applied to node VPP of high voltage switch circuit 2. Then, gate control signal A is generated in accordance with control signal B and an output from timer circuit 4.

The output from timer circuit 4 attains to power supply voltage level VCC delayed by a prescribed period of time (a delay time $\Delta t1$) with respect to the rise of control signal B. Delay time $\Delta t1$ is controlled by the amount of electric charges in capacitor C1 and a current for discharging the electric charges.

Gate control signal A is switched to attain to power supply voltage VCC level from ground voltage level GND when the voltage applied to node VPP attains to the voltage level at which voltage control is required, in accordance with the following equation (5). It is noted that, in equation (5), tr and VPP respectively represent the rising time of the high voltage and the voltage at node VPP.

$$V(t) = (VPP - VCC)/tr \times t + VCC \tag{5}$$

Figure 9:
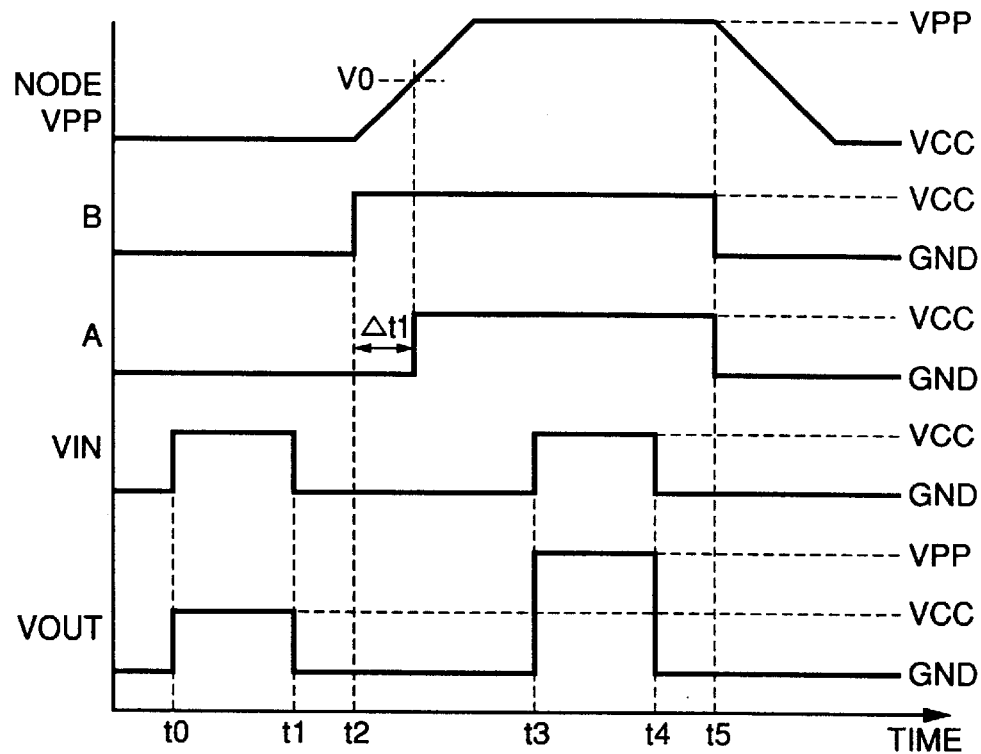
FIG. 9 is a timing chart shown in conjunction with a control method for high voltage switch circuit 2 according to the second embodiment.

Referring to FIG. 9, when power supply voltage VCC is applied to node VPP (up to t2), control signal B is at ground voltage level GND. Accordingly, input signal VIN received between times t0 and t1 is converted to a signal VOUT at power supply voltage level VCC for output.

When application of the high voltage to node VPP is started (at a time t2), the level of control signal B is switched from ground voltage level GND to power supply voltage level VCC.

When a prescribed period of time is elapsed (t2+$\Delta t1$) after application of the high voltage to node VPP is started, gate control signal A attains to power supply voltage level VCC. At this point of time, the voltage applied to node VPP is at a prescribed voltage V0 (the voltage at which voltage control is required).

Thus, voltage control is performed, and input signal VIN received between times t3 and t4 is converted to signal VOUT at high voltage level VPP for output.

Then, when the level of the voltage applied to node VPP is decreased (application of the high voltage is finished) (a time t5), the level of control signal B is changed from power supply voltage level VCC to ground voltage level GND.

Such a control method allows control of the voltage level at internal nodes N1 and N2 in high voltage switch circuit 2 when switching to the high voltage.

When application of the high voltage to node VPP is finished or when power supply voltage VCC is applied without application of the high voltage, the gate voltages of transistors for voltage control Q3 and Q4 are changed from power supply voltage VCC to ground voltage GND or fixed at ground voltage GND. Thus, high voltage switch circuit 2 enables a normal switching operation even if the level of the voltage applied to node VPP is low.

The control method will be described as applied to semiconductor memory device 1000. Reference voltage generation circuit 3 is included in a reference voltage generation circuit 108. When the high voltage is not required, writing/erasing control circuit 1 outputs control signal B at ground voltage level GND with respect to AND circuit 90. At this point of time, high voltage generation circuit 106 is in the inactive state.

Then, when command CM designating a specific operation is input to writing/erasing control circuit 1, control signal B at power supply voltage level VCC is output from writing/erasing control circuit 1, and high voltage generation circuit 106 is activated.

When the output voltage of high voltage generation circuit 106 exceeds a prescribed voltage level V0, gate control signal A input to the gate of the transistor for voltage control attains to power supply voltage level VCC.

When application of the high voltage is finished, the level of control signal B is changed to ground voltage level GND, and high voltage generation circuit 106 is inactivated. The level of the voltage applied to node VPP is decreased to attain to power supply voltage level VCC. Such a control method enables semiconductor memory device 1000 to perform a correct writing/erasing/reading operation. It is noted that a signal directly controlling activation/inactivation of high voltage generation circuit 106 may be used as control signal B.

It is noted that the method according to the second embodiment is not only applied to high voltage switch circuit 2 but also applicable to the above described high voltage switch circuits 2A, 2B and the like. Further, it can be applied to a high voltage switch circuit switching input signal VIN to signal VOUT at amplitude level VN–VCC.

Third Embodiment

Figure 10:
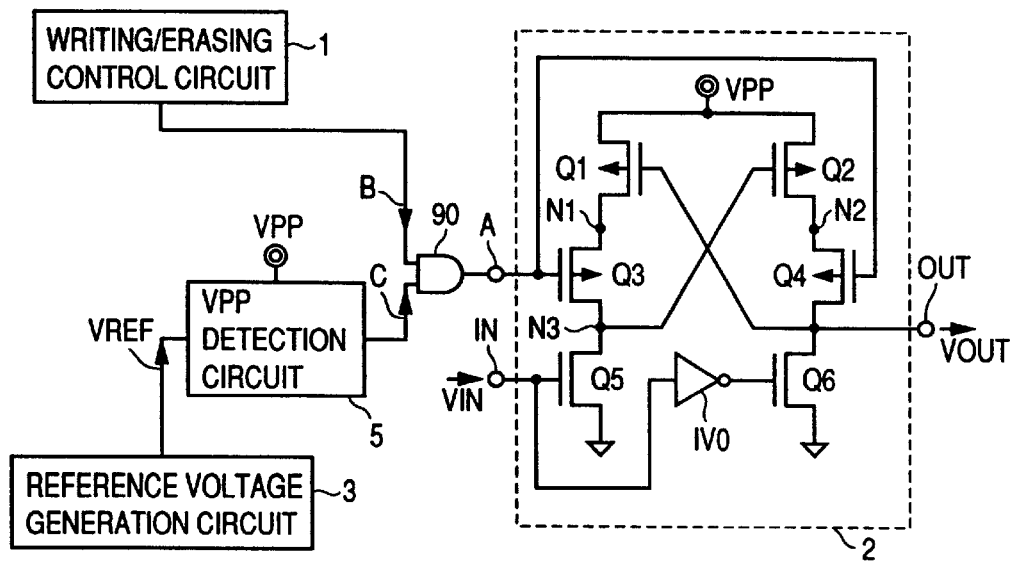
FIG. 10 is a diagram shown in conjunction with control of a high voltage switch circuit 2 according to the third embodiment.
Figure 11:
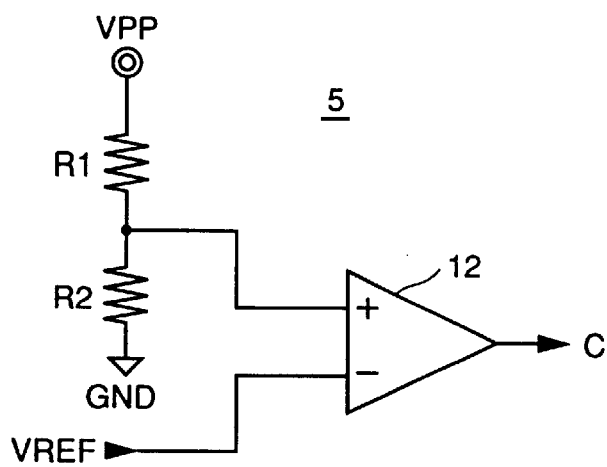
FIG. 11 is circuit diagram showing the structure of a VPP detection circuit 5.

A high voltage switch circuit according to the third embodiment will now be described with reference to FIGS. 10 and 11. In the third embodiment, an AND circuit 90 outputs a gate control signal A in accordance with a control signal B output from writing/erasing control circuit 1 and a level detection signal C output from a VPP detection circuit 5. Transistors for voltage control Q3 and Q4 included in high voltage switch circuit 2 have their gates receiving gate control signals A generated by control signal B and level detection signal C.

VPP detection circuit 5 will be described. VPP detection circuit 5 includes resistors R1 and R2 as well as a voltage comparison circuit 12 as shown in FIG. 11. Resistors R1 and R2 are connected in series between a node VPP receiving a high voltage and a node GND receiving a ground voltage. A connection node of resistors R1 and R2 is connected to a positive input terminal of voltage comparison circuit 12. A negative input terminal of voltage comparison circuit 12 receives a reference voltage VREF output from a reference voltage generation circuit 3.

The voltage received at node VPP is divided by resistors R1 and R2. As a result, a voltage VPPn expressed by the following equation (6) is obtained. Assume that resistance values of resistors R1 and R2 are respectively R1 and R2.

$$VPPn = VPP \times \{R2/(R1+R2)\} \quad (6)$$

Voltage comparison circuit 12 compares divided voltage VPPn and reference voltage VREF for outputting level detection signal C as a comparison result. Resistance values R1 and R2 are determined to satisfy the following equation (7).

$$VREF = VPP \times \{R2/(R1+R2)\} \quad (7)$$

VPP generation circuit 5 outputs level detection signal C at an H level if divided voltage VPPn exceeds reference voltage VREF, and outputs level detection signal C at an L level in all other cases.

When the above described structure is applied to a semiconductor memory device 1000, outputs from high voltage generation circuit 106 are supplied to nodes VPP of VPP detection circuit 5 and high voltage switch circuit 2.

Next, a control method for high voltage switch circuit 2 according to the third embodiment will be described. Control signal B is changed in accordance with the level of the voltage applied to node VPP of high voltage switch circuit 2. Then, gate control signal A is generated in accordance with control signal B and level detection signal C output from VPP detection circuit 5. Level detection signal C attains to the H level when the voltage applied to node VPP exceeds a prescribed level.

Figure 12:
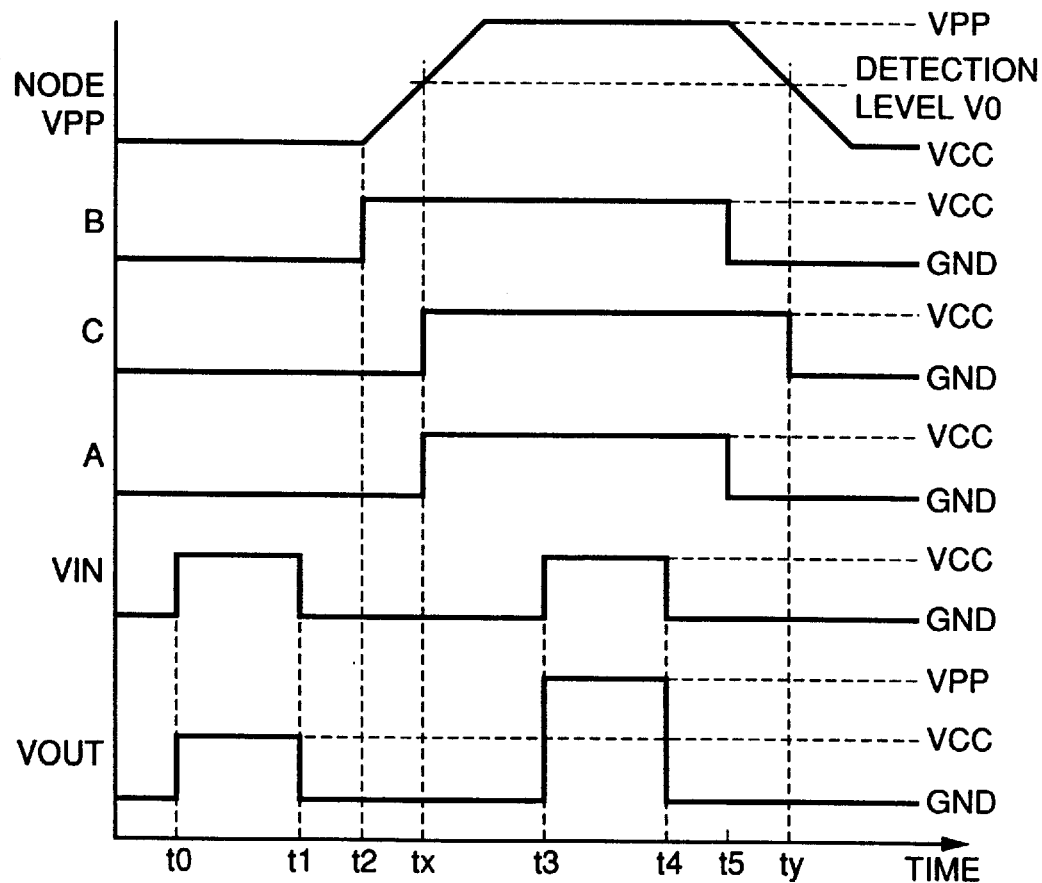
FIG. 12 is a timing chart shown in conjunction with a control method for a high voltage switch circuit 2 according to the third embodiment.

Referring to FIG. 12, when power supply voltage VCC is applied to node VPP, (up to t2), the voltage level of control signal B is ground voltage level GND. Accordingly, input signal VIN received between times t0 and t1 is converted to a signal VOUT at power supply voltage level VCC for output.

When application of the high voltage to node VPP is started (time t2), the level of control signal B is changed from ground voltage level GND to power supply voltage level VCC.

When the voltage applied to node VPP exceeds a prescribed detection level V0 (time tx), level detection signal C attains to power supply voltage level VCC from ground voltage level GND. Gate control signal A attains to power supply voltage level VCC from ground voltage level GND (t2<tx<t3).

Thus, voltage control is performed, and input signal VIN received between times t3 and t4 is converted to signal VOUT at high voltage level VPP for output.

Then, when the voltage applied to node VPP is decreased (when application of the high voltage is finished) (time t5), control signal B is charged from power supply voltage level VCC to ground voltage level GND. Gate control signal A attains to ground voltage level GND from power supply voltage level VCC. When the voltage applied to node VPP falls below detection level V0 (time ty), level detection signal C attains to ground voltage level GND from power supply voltage level VCC.

Such a control method enables control of the voltage level at internal nodes N1 and N2 in high voltage switch circuit 2 when switching to the high voltage. When application of the high voltage to node VPP is finished or when power supply voltage VCC is applied without application of the high voltage, the gate of the transistor for voltage control attains to ground voltage level GND from power supply voltage level VCC or fixed at ground voltage level GND. Thus, even when the voltage applied to node VPP is low, a normal operation of high voltage switch circuit 2 is ensured.

The control method as applied to semiconductor memory device 1000 will now be described. When the high voltage is not required, writing/erasing control circuit 1 outputs control signal B at ground voltage level GND to AND circuit 90. At this point of time, high voltage generation circuit 106 is in an inactive state.

When a command CM designating a specific operation is input to writing/erasing control circuit 1, control signal B at power supply voltage level VCC is output from writing/ erasing control circuit 1, so that high voltage generation circuit 106 is activated.

When the output voltage of high voltage generation circuit 106 exceeds a detection level V0, gate control signal A input to the gate of the transistor for voltage control attains to power supply voltage level VCC.

Then, when application of the high voltage is finished, control signal B attains to ground voltage level GND, so that high voltage generation circuit 106 is inactivated. The voltage applied to node VPP is decreased to attain to power supply voltage level VCC.

Such control enables semiconductor memory device 1000 to perform a normal writing/erasing/reading operation. It is noted that a signal directly controlling activation/ inactivation of high voltage generation circuit 106 may be used as control signal B.

It is noted that detection level V0 may be set to have different values when the voltage increases and decreases. If the values of the detection levels are different when increasing and decreasing, resistors R1 and R2 of VPP detection circuit 5 would be variable resistors, so that resistance values may vary according to signals respectively output when increasing and decreasing from writing/erasing control circuit 1.

It is noted that the method of the third embodiment is not only applied to high voltage switch circuit 2, but is also applicable to the above described high voltage switch circuits 2A, 2B and the like. In addition, the method may also be applied to a high voltage switch circuit switching input signal VIN to signal VOUT at amplitude level VN–VCC.

Fourth Embodiment

Figure 13:
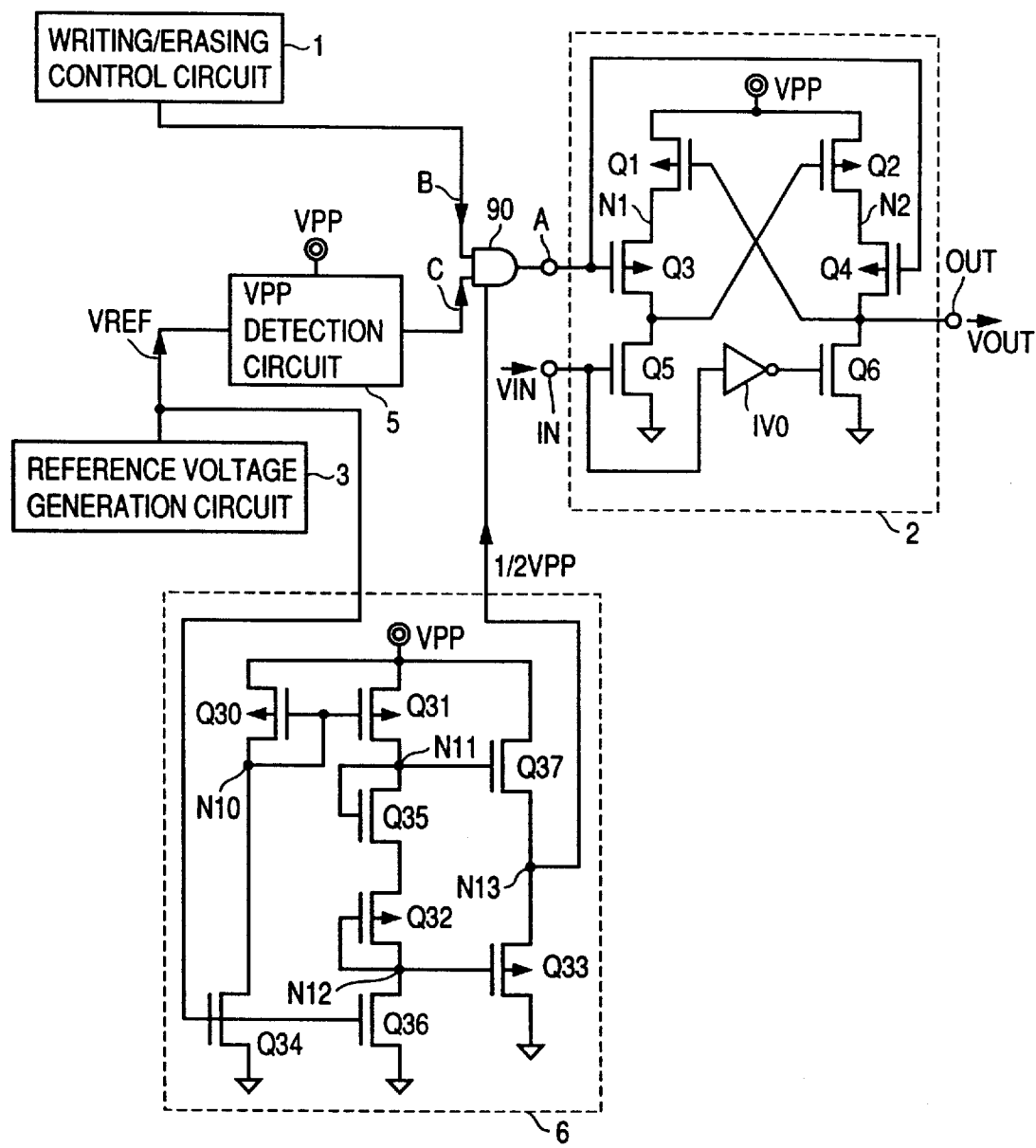
FIG. 13 is a diagram shown in conjunction with control of a high voltage switch circuit 2 according to the fourth embodiment.

A high voltage switch circuit according to the fourth embodiment will be described with reference to FIG. 13. In the fourth embodiment, an AND circuit 90 receives an output from ½ VPP detection circuit 6 as an operation power supply voltage.

½ VPP detection circuit 6 will be described. ½ VPP detection circuit includes transistors Q30 to Q37. Transistors Q30 to Q33 are PMOS transistors, whereas transistors Q34 to Q37 are NMOS transistors.

Transistor Q30 is connected between a node VPP supplied with a high voltage and a node N10, whereas transistor Q34 is connected between node N10 and a node GND receiving a ground voltage GND. Transistor Q30 has its gate connected to node N10. Transistors Q34 and Q36 have their gates receiving a reference voltage VREF output from a reference voltage generation circuit 3.

Transistor Q31 is connected between nodes VPP and N11 and has its gate connected to node N10. Transistors Q35 and Q32 are connected in series between nodes N11 and N12, and transistor Q36 is connected between nodes N12 and GND. Transistor Q35 has its gate connected to node N11, and transistor Q32 has its gate connected to node N12.

Transistor Q37 is connected between nodes VPP and N13, whereas transistor Q33 is connected between nodes N13 and GND. Transistors Q37 and Q33 have their gates connected to nodes N11 and N12, respectively.

A node N13, which is a connection node of transistors Q33 and Q37, attains to a voltage level (½ VPP) which is a high voltage VPP.

Next, a control method for high voltage switch circuit 2 according to the fourth embodiment will be described. A gate control signal A controlling the gate of the transistor for voltage control is generated in accordance with a control signal B and a level detection signal C. At the time, gate control signal A is converted to a voltage ½ VPP which is less dependent on VCC. Gate control signal A attains to a ½ VPP level in a range where the voltage supplied to node VPP exceeds a detection level V0.

Figure 14:
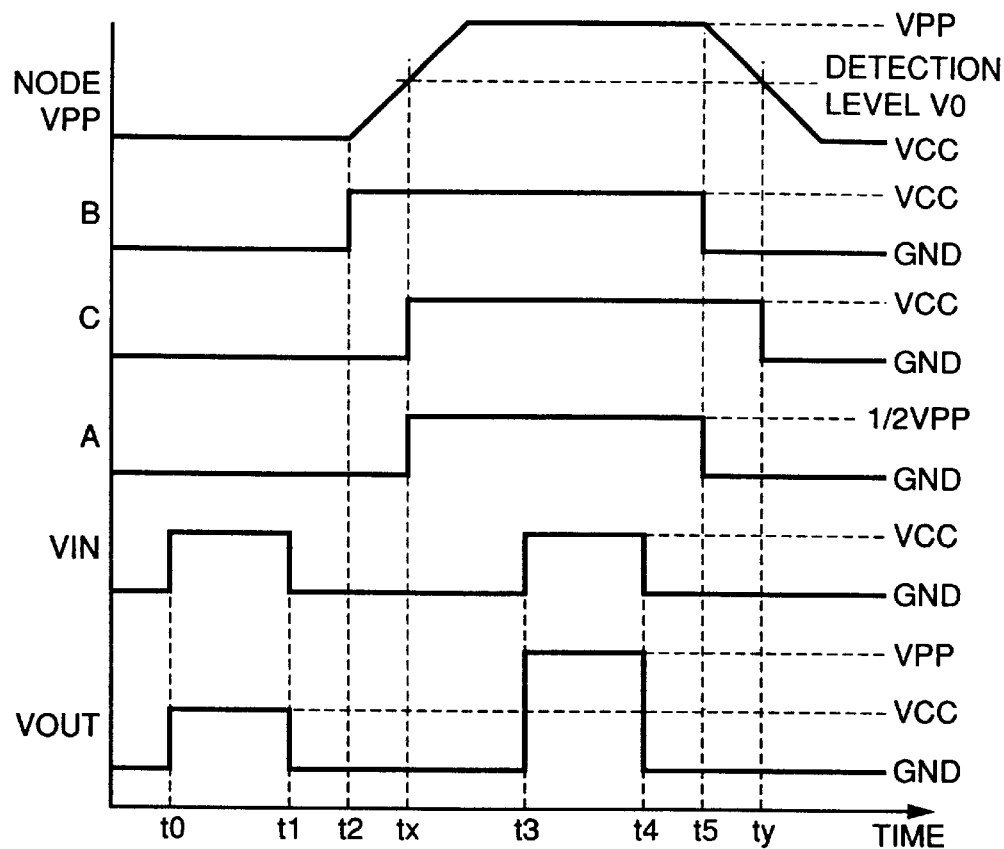
FIG. 14A is a timing chart shown in conjunction with a control method for high voltage switch circuit 2 according to the fourth embodiment.

Referring to FIG. 14, when power supply voltage VCC is applied to node VPP (up to t2), control signal B and level detection signal C are both at ground voltage level GND. Gate control signal A is at ground voltage level GND. Accordingly, input signal VIN received between times t0 and t1 is converted to signal VOUT at power supply voltage level VCC for output.

When application of the high voltage to node VPP is started (time t2), control signal B attains to power supply level VCC from ground voltage level GND.

When the level of the voltage applied to node VPP exceeds detection level V0 (time t2), level detection signal C attains to power supply voltage level VCC from ground voltage level GND. Gate control signal A attains to the ½ VPP level.

Thus, voltage control is performed and input signal VIN received between times t3 and t4 is converted to signal VOUT at high voltage level VPP for output.

When the level of the voltage applied to node VPP is decreased (when application of the high voltage is finished) (time t5), control signal B attains to ground voltage level GND from power supply voltage level VCC. Gate control signal A attains to ground voltage level GND.

When the level of the voltage applied to node VPP falls below detection level V0 (time ty), level detection signal attains to ground voltage level GND from power supply voltage level VCC.

Figure 15:
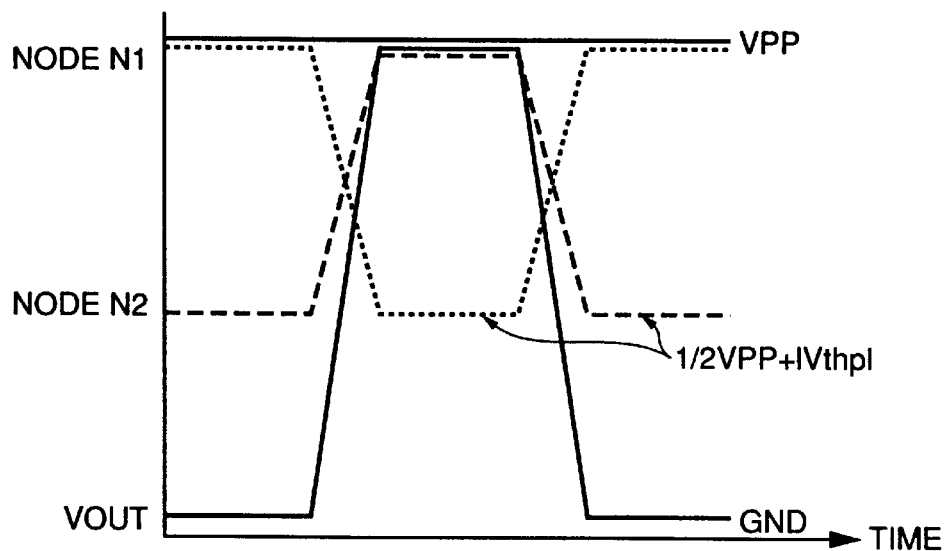
FIG. 15 is a timing chart shown in conjunction with voltage control in high voltage switch circuit 2 according to the fourth embodiment.

By the above described control method, the voltage levels of internal nodes N1 and N2 in high voltage switch circuit 2 change as shown in FIG. 15 when switching the high voltage. Referring to FIG. 15, the source-drain voltage of the PMOS transistor forming the circuit is controlled to (½ VPP+|Vthp|).

Then, when application of the high voltage to node VPP is finished or power supply voltage VCC is applied without application of the high voltage, the gate of the transistor for voltage control attains to ground voltage level GND from the ½ VPP level, or fixed at ground voltage level GND. Thus, even if the voltage applied to node VPP is low, a normal operation of high voltage switch circuit 2 is ensured.

The control method will be described as applied to semiconductor memory device 1000. When a high voltage is not required, writing/erasing control circuit 1 outputs control signal B at ground voltage level GND. At this point of time, high voltage generation circuit 106 is in an inactive state.

When a command CM designating a specific operation is input to writing/erasing control circuit 1, control signal B at power supply voltage level VCC is output from writing/ erasing control circuit 1, so that high voltage generation circuit 106 is activated. When the level of the output voltage of high voltage generation circuit 106 exceeds detection level V0, gate control signal A input to the gate of the transistor for voltage control attains to the ½ VPP level.

When application of the high voltage is finished, control signal B attains to ground voltage level GND, so that high voltage generation circuit 106 is inactivated. The level of the voltage applied to node VPP is decreased to attain the power supply voltage level VCC.

The above described control enables semiconductor memory device 1000 to perform a normal writing/erasing/reading operation. It is noted that a signal directly controlling activation/inactivation of high voltage generation circuit 106 may be used as control signal B.

It is noted that the method of the fourth embodiment is not only applied to high voltage switch circuit 2, but also applicable to the above described high voltage switch circuits 2A, 2B and the like. In addition, the method can also be applied to a high voltage switch circuit switching input signal VIN to signal VOUT at amplitude level VN–VCC.

Fifth Embodiment

Figure 16:
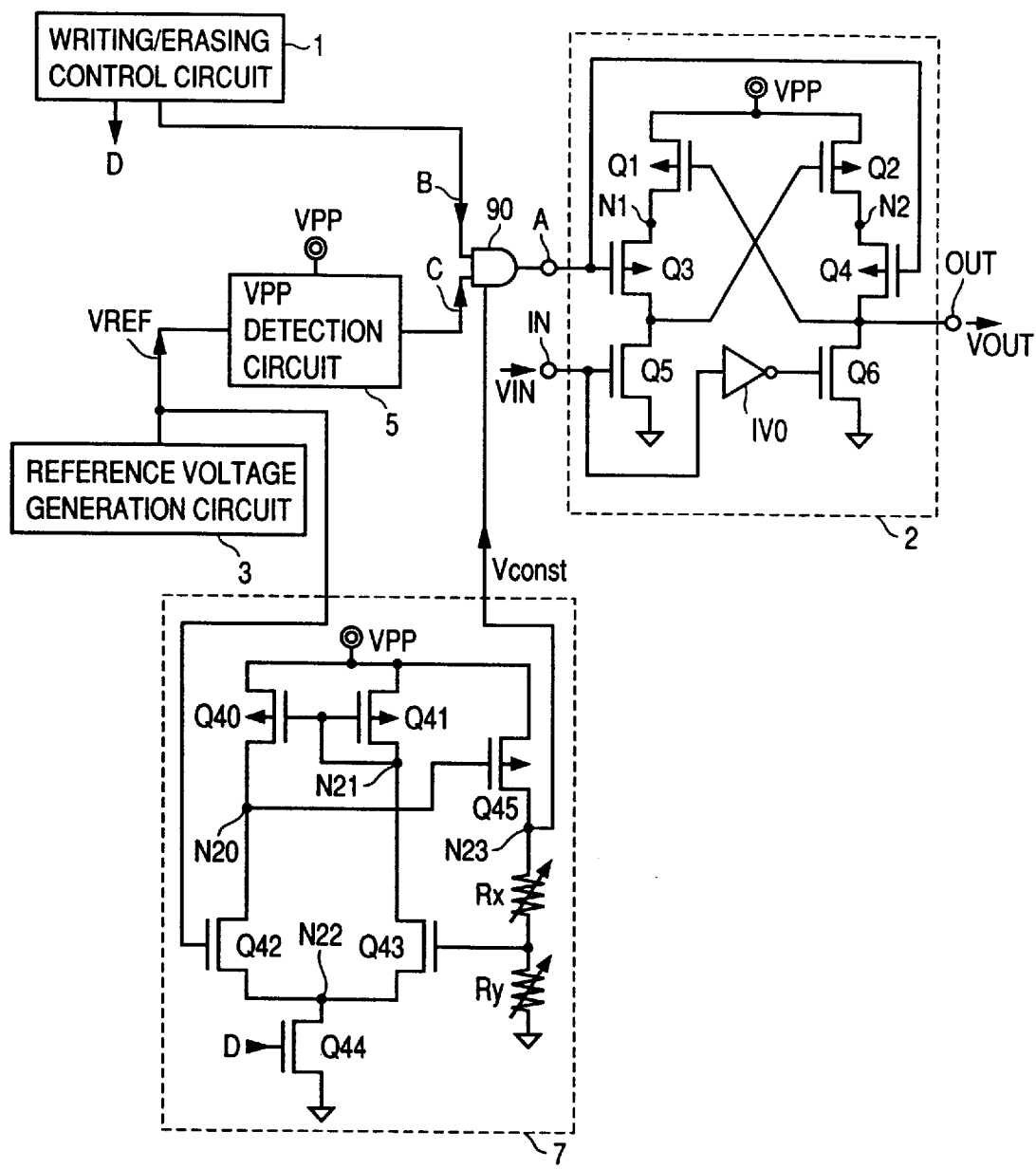
FIG. 16 is a diagram shown in conjunction with control of a high voltage switch circuit 2 according to the fifth embodiment.

A high voltage switch circuit according to the fifth embodiment will now be described with reference to FIG. 16. In the fifth embodiment, an AND circuit 90 receives an output from a constant voltage generation circuit 7 as an operation power supply voltage.

Constant voltage generation circuit 7 will be described. Constant voltage generation circuit 7 includes transistors Q40 to Q45 and variable resistors Rx and Ry. Transistors Q40, Q41 and Q45 are PMOS transistors, whereas transistors Q42 and Q43 are NMOS transistors.

Transistors Q40 to Q44 form a current mirror differential amplifier. Transistors Q40 and Q41 form a PMOS current mirror circuit, and transistor Q44 functions as a constant current source. Transistor Q40 is connected between a node VPP supplied with a high voltage and a node N20, whereas transistor Q41 is connected between nodes VPP and N21. Transistors Q40 and Q41 have their gates connected to node N21.

Transistor Q42 is connected between nodes N20 and N22, and transistor Q43 is connected between nodes N21 and N22. Transistor Q42 has its gate receiving a reference voltage VREF output from a reference voltage generation circuit 3, and transistor Q43 has its gate connected to a connection node of variable resistors Rx and Ry. Transistor Q44 is connected between node N22 and a node GND receiving ground voltage GND, and has its gate receiving a control signal output from a writing/erasing control circuit 1.

Transistor Q45 is connected between nodes VPP and N23, and variable resistors Rx and Ry are connected in series between nodes N23 and GND. A voltage Vconst at node N23 satisfies the following equation (8). Assume that resistance values of variable resistors Rx and Ry are respectively Rx and Ry.

$$Vconst = VREF \times \{(Rx+Ry)/Ry\} \quad (8)$$

Here, reference voltage VREF is independent of power supply voltage VCC as shown in equation (4), so that voltage Vconst is also independent of power supply voltage VCC.

A control method for high voltage switch circuit 2 according to the fifth embodiment will now be described. A gate control signal A controlling the gate of the transistor for voltage control is generated in accordance with control signal B, level detection signal C, and control signal D. At the time, the voltage of gate control signal A is converted to voltage Vconst, which is not dependent on power supply voltage VCC. Gate control signal A attains to constant voltage level Vconst in a range where the voltage supplied to node VPP is at least detection level V0.

Figure 17:
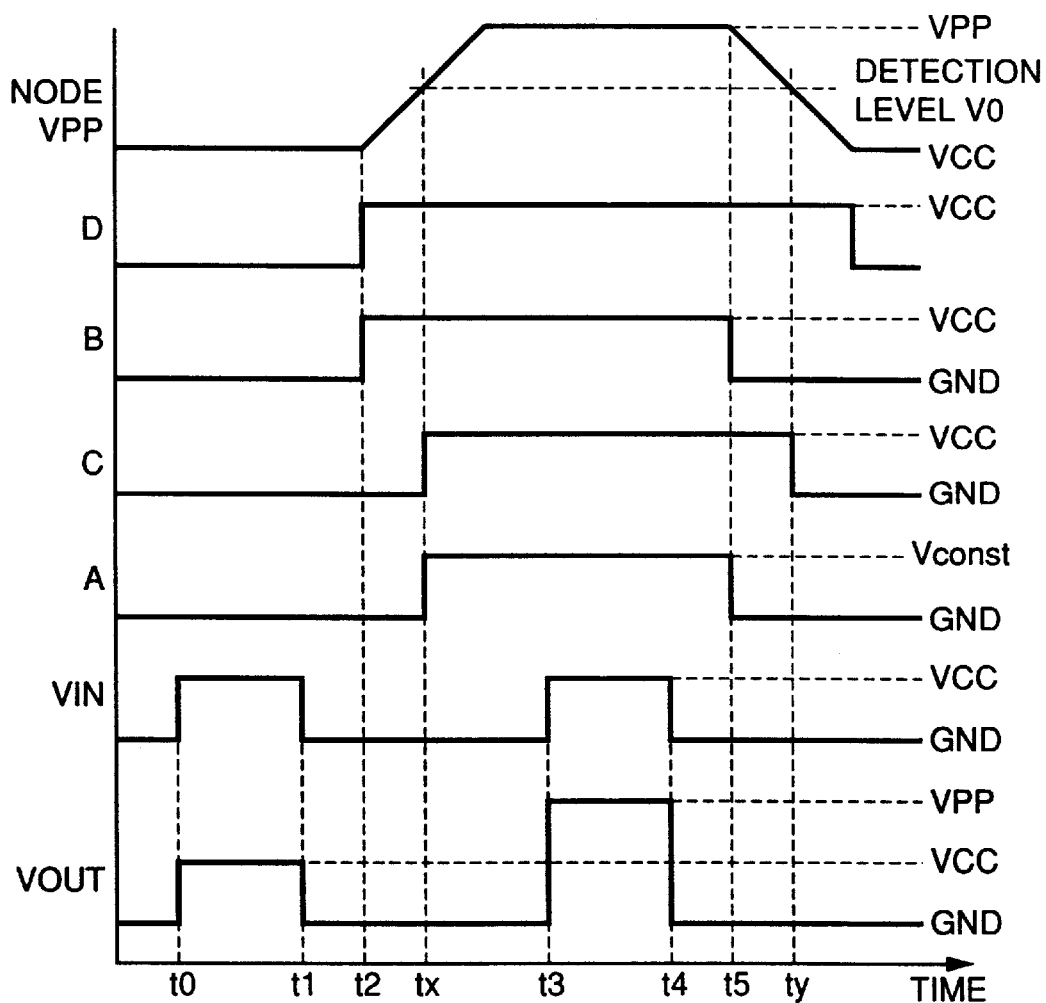
FIG. 17 is a timing chart shown in conjunction with a control method for high voltage switch circuit 2 according to the fifth embodiment.

Referring to FIG. 17, when power supply voltage VCC is applied to node VPP (up to t2), control signal B and level detection signal C are at ground voltage level GND, so that gate control signal A is at ground voltage level GND. Accordingly, input signal VIN received between times t0 and t1 is converted to signal VOUT at power supply voltage level VCC for output.

When application of the high voltage to node VPP is started (time t2), control signals B and D attain to power supply voltage level VCC from ground voltage level GND.

When the level of the voltage applied to node VPP exceeds a prescribed detection level V0 (time t2), level detection signal C attains to power supply voltage level VCC from ground voltage level GND. The voltage of gate control signal A attains to constant voltage level Vconst.

Thus, voltage control is performed and input signal VIN received between times t3 and t4 is converted to signal VOUT at high voltage level VPP for output.

Then, when the level of the voltage applied to node VPP is decreased (when application of the high voltage is finished) (time t5), control signal B attains to ground voltage level GND from power supply voltage level VCC. Gate control signal A attains to ground voltage level GND.

When the level of the voltage applied to node VPP falls below detection level V0 (time ty), level detection signal C attains to ground voltage level GND from constant voltage level Vconst.

Figure 18:
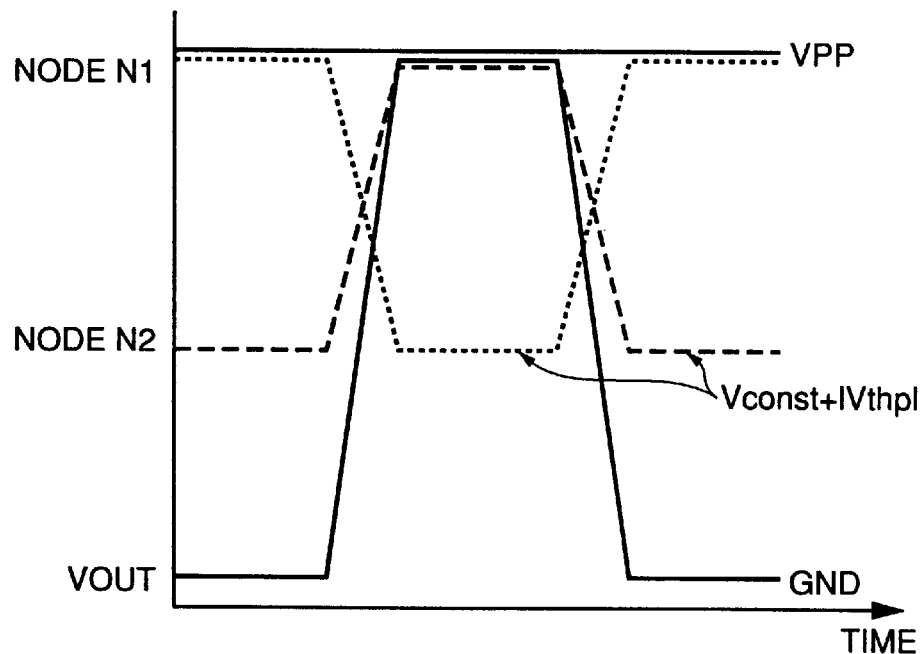
FIG. 18 is a timing chart shown in conjunction with voltage control in high voltage switch circuit 2 according to the fifth embodiment.

With the above described control method, the voltage levels at internal nodes N1 and N2 in high voltage switch circuit 2 change as shown in FIG. 18 when switching the high voltage. Referring to FIG. 18, the source-drain voltages of transistors Q1 and Q2 are controlled to {VPP–(Vconst+|Vthp|)}, and the source-drain voltages of transistors Q3 and Q4 are controlled to (Vconst+|Vthp|).

Then, when application of the high voltage to node VPP is finished or when power supply voltage VCC is applied without application of the high voltage, the gate of the transistor for voltage control attains to ground voltage level GND from constant voltage level Vconst, or fixed at ground voltage level GND. Thus, even when the voltage of applied to node VPP is low, a normal operation of high voltage switch circuit 2 is enabled.

By adjusting the resistance value of the variable resistor in constant voltage generation circuit 7, the level of constant voltage Vconst can arbitrarily be set.

The control method will be described as applied to semiconductor memory device 1000. When a high voltage is not required, writing/erasing control circuit 1 outputs control signals B and D at ground voltage level GND. At this point of time, high voltage generation circuit 106 is in the inactive state.

When a command CM designating a specific operation is input to writing/erasing control circuit 1, control signals B and D at power supply voltage level VCC are output from writing/erasing control circuit 1, so that high voltage generation circuit 106 is activated. Then, when the level of the output voltage of high voltage generation circuit 106 exceeds detection level V0, the voltage of gate control signal A input to the gate of the transistor for voltage control attains to Vconst.

When application of the high voltage is finished, control signal B attains to ground voltage level GND, and high voltage generation circuit 106 is inactivated. The level of the voltage applied to node VPP is decreased to attain to power supply voltage level VCC. Then, control signal D attains to ground voltage level GND.

Such control enables semiconductor memory device 1000 to perform a normal writing/erasing/reading operation. It is noted that a signal directly controlling activation/ inactivation of high voltage generation circuit 106 may be used as control signal B.

Figure 19:
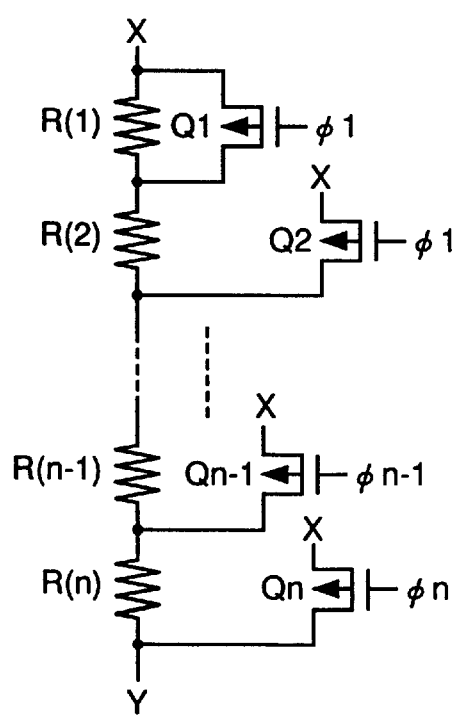
FIGS. 19 and 20 are circuit diagrams exemplifying the structure of variable resistors.
Figure 20:
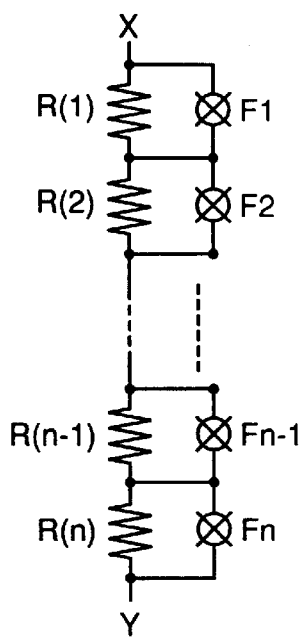

It is noted that exemplary variable resistors Rx and Ry in constant voltage generation circuit 7 are shown in FIGS. 19 and 20. The variable resistor shown in FIG. 19 includes a plurality of resistors R (1) to R (n) connected in series between nodes X and Y, and switching elements (transistors) T1 to Tn for selecting the resistors.

Switching elements T1 to Tn receive switching element control signals $\phi 1$ to $\phi n$ to be turned on, respectively. By turning on/off the switching elements, the resistance value between nodes X and Y is changed.

The variable resistor shown in FIG. 20 includes a plurality of resistors R (1) to R (n) connected in series between nodes X and Y and fuses F1 to Fn for selecting resistors. By blowing the fuse, the resistance value between nodes X and Y is changed.

Sixth Embodiment

A high voltage switch circuit according to the sixth embodiment will now be described with reference to FIG. 21. A high voltage switch circuit 8 shown in FIG. 21 converts an input signal VIN (amplitude VCC–GND) to signal VOUT (amplitude VCC–VN). Here, VN is a negative high voltage as described above.

High voltage switch circuit 8 includes transistors Q1n to Q5n as well as an inverter IV2. Transistors Q1n and Q2n are PMOS transistors, whereas transistors Q3n, Q4n and Q5n are NMOS transistors.

High voltage switch circuit 8 receives input signal VIN from signal input node IN and receives a gate control signal A controlling the gate voltage of the transistor for voltage control from control signal input node A for outputting signal VOUT from output node OUT.

Transistor Q5n is connected between node N1n and node VN for receiving a negative high voltage, and has its gate receiving signal VOUT of output node OUT. Transistor Q6n is connected between nodes N2n and VN and has its gate receiving a signal of node N3n.

Transistor Q3n is connected between nodes N1n and N3n, whereas transistor Q4n is connected between node N2n and node OUT.

Transistor Q1n is connected between signal input node IN and node N3n, and has its gate connected to a node GND receiving a ground voltage. Inverter IV2 inverts a signal of node IN. Transistor Q2n is connected between an output node of inverter IV2 and node OUT, and has its gate connected to node GND.

Transistors Q3n and Q4n are transistors for voltage control and form a voltage control circuit 20 for controlling the gate voltage of the transistors forming the circuit. Unlike the conventional case, the gates of transistors for voltage control Q3n and Q4n are structured to receive externally input gate control signals A rather than a constant voltage.

Gate control signals A input to the gates of transistors Q3n and Q4n are output from an NAND circuit 91 receiving control signal B output from writing/erasing control circuit 1 and level detection signal E output from VN detection circuit 9.

Figure 22:
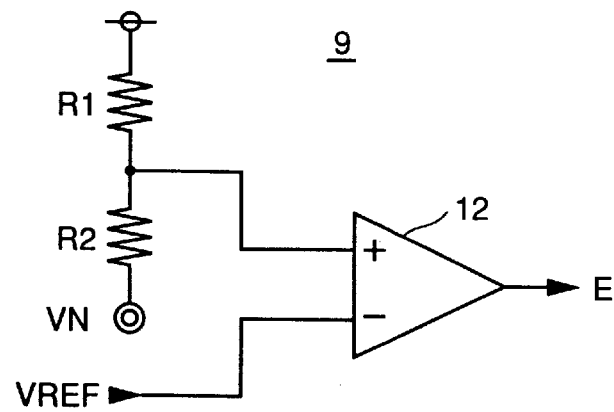
FIG. 22 is a circuit diagram showing the structure of a VN detection circuit 9.

VN detection circuit 9 includes resistors R1 and R2 as well as a voltage comparison circuit 12 as shown in FIG. 22. In VN detection circuit 9, resistors R1 and R2 are connected in series between a node VCC receiving power supply voltage VCC and a node VN receiving negative high voltage VN. A connection node of resistors R1 and R2 is connected to a positive input terminal of voltage comparison circuit 12. The negative input terminal of voltage comparison circuit 12 receives a reference voltage VREF output from a reference voltage generation circuit 3.

The voltage received at node VN is divided by resistors R1 and R2. As a result, a voltage VNn expressed by the following equation (9) is obtained. It is noted that VN represents the voltage level at node VN. The resistance values of resistors R1 and R2 are respectively R1 and R2.

$$VNn=(VCC+VN)\times\{R2/(R1+R2)\} \quad (9)$$

Voltage comparison circuit 12 compares divided voltage VNn and reference voltage VREF for outputting a level detection signal E as a comparison result. Resistance values R1 and R2 are determined to satisfy the following equation (10).

$$VREF=(VN+VCC)\times\{R2/(R1+R2)\} \quad (10)$$

If divided voltage VNn is lower than reference voltage VREF, level detection signal E would be at an H level, but at an L level in all the other cases.

When the above described structure is applied to semiconductor memory device 1000, a high voltage switch circuit 8 is included in a high voltage switch circuit 120, and the outputs from a negative high voltage generation circuit 107 are applied to nodes VN of VN detection circuit 9 and high voltage switch circuit 8.

Next, a control method for high voltage switch circuit 8 according to the sixth embodiment will be described. Control signal B is changed in accordance with the level of the voltage applied to node VN. Then, gate control signal A is generated in accordance with control signal B and level detection signal E output from VN detection circuit 9. Level detection circuit E attains to the H level when the voltage applied to node VN falls below a prescribed level.

Figure 23:
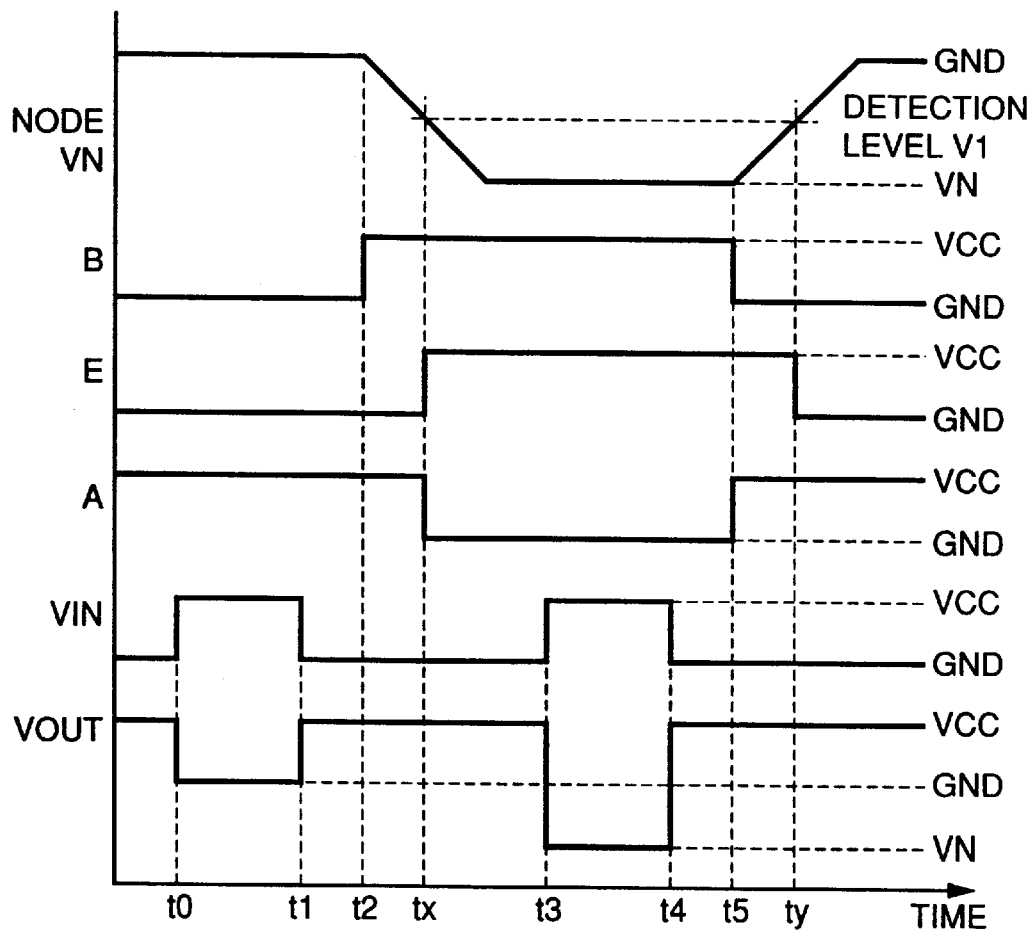
FIG. 23 is a timing chart shown in conjunction with a control method for high voltage switch circuit 8 according to the sixth embodiment.

Referring to FIG. 23, high voltage switch circuit 8 is at the GND level between t0 and t1 as well as between t3 and t4, and receives input signal VIN at power supply voltage level VCC otherwise. In the initial state, a ground voltage GND is applied to node VN.

When ground voltage GND is applied to node VN (up to t2), the voltage level of control signal B is at ground voltage level GND. Accordingly, input signal VIN received between t0 and t1 is converted to signal VOUT at ground voltage level GND for output.

When application of the negative high voltage to node VN is started (time t2), the level of control signal B attains to power supply voltage level VCC from ground voltage level GND.

When the level of the voltage applied to node VN falls below a prescribed detection level V1 (time tx), the level of level detection signal E changes to power supply voltage level VCC from ground voltage level GND. The level of gate control signal A changes to ground voltage level GND from power supply voltage level VCC (t2<tx<t3)

Thus, voltage control is performed, and input signal VIN received between t3 and t4 is converted to signal VOUT at negative high voltage level VN for output.

Then, when the level of the voltage applied to node VN is boosted (when application of the negative high voltage is finished) (time t5), the level of control signal B is changed to ground voltage level GND from power supply voltage level VCC. The level of gate control signal A is changed to power supply voltage level VCC from ground voltage level GND.

When the level of the voltage applied to node VN exceeds detection level V1 (time ty), level detection signal E attains to ground voltage level GND from power supply voltage level VCC.

Figure 24:
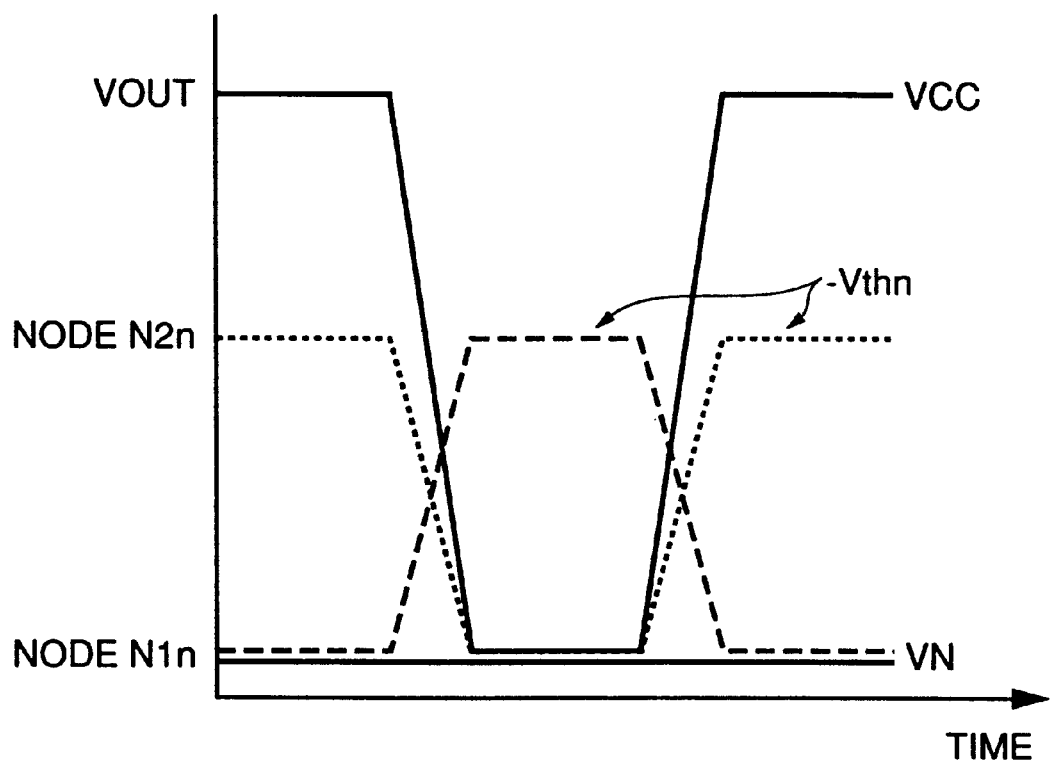
FIG. 24 is a timing chart shown in conjunction with voltage control in high voltage switch circuit 8 according to the sixth embodiment.

The above described control method allows the voltage levels at internal nodes N1n and N2n in high voltage switch circuit 8 to change as shown in FIG. 24 when switching to the high voltage. Referring to FIG. 24, the source-drain voltages of the NMOS transistors are controlled to (VCC+Vthn) and |VN−Vthn| for transistors Q3n, Q4n and Q5n, Q6n, respectively, Here, Vthn represents threshold values of transistors Q3n and Q4n.

Then, when application of the negative high voltage to node VN is finished or when grand voltage GND is applied without application of the negative high voltage, the gate of the transistor for voltage control attains to power supply voltage level VCC from ground voltage level GND or is fixed at power supply voltage level VCC. Thus, even if the absolute value of the voltage applied to node VN is small, a normal operation of high voltage switch circuit 8 is enabled.

The control method will be described as applied to semiconductor memory device 1000. When a negative high voltage is not required, writing/erasing control circuit 1 outputs control signal B at the L level to an NAND circuit 91. At this point of time, negative high voltage generation circuit 107 is in the inactive state.

When a command CM for designating a specific operation is input to writing/erasing control circuit 1, control signal B at power supply voltage level VCC is output from writing/erasing control circuit 1, and negative high voltage generation circuit 107 is activated.

When the level of the output voltage of negative high voltage generation circuit 107 falls below detection level V1, gate control signal A input to the gate of the transistor for voltage control attains to ground voltage level GND.

When application of the negative high voltage is finished, control signal B attains to ground voltage level GND, and negative high voltage generation circuit 107 is inactivated. The level of the voltage applied to node VN is increased to attain to power supply voltage level VCC.

Such control ensures a normal writing/erasing/reading operation of semiconductor memory device 1000. It is noted that a signal directly controlling activation/inactivation of negative high voltage generation circuit 107 may be used as control signal B.

Figure 21:
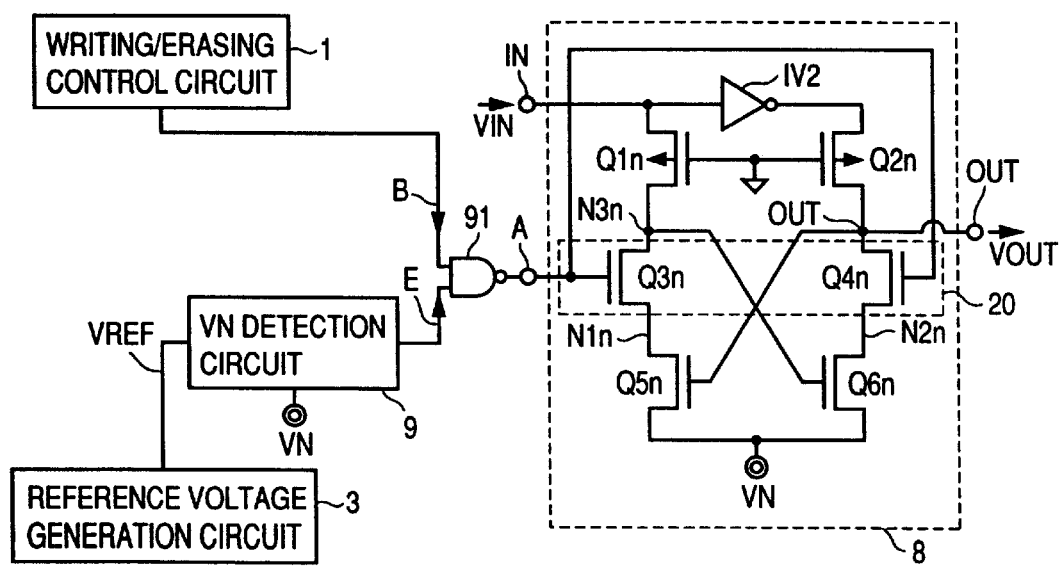
FIG. 21 is a diagram shown in conjunction with control of a high voltage switch circuit 8 according to the sixth embodiment.
Figure 25:
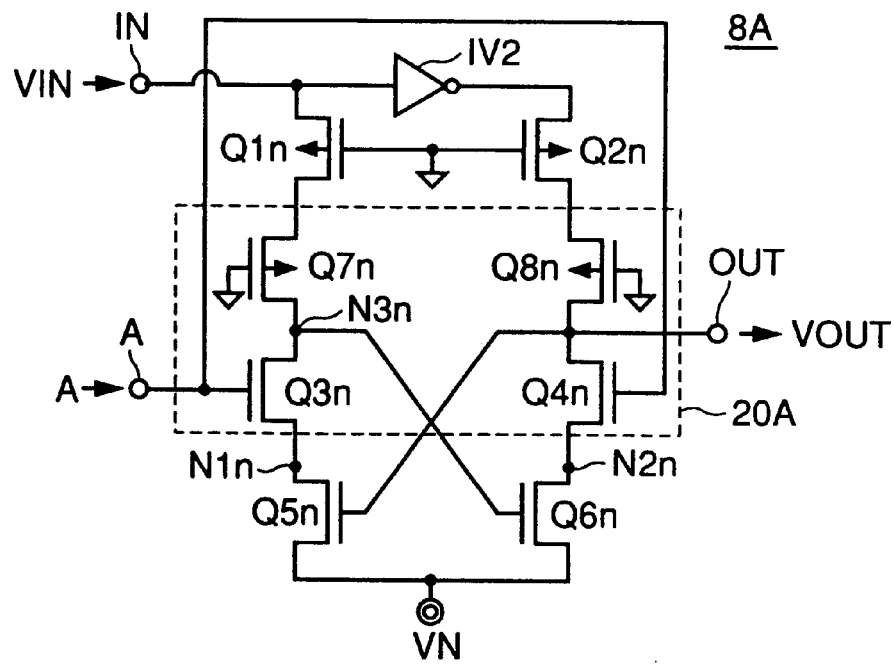
FIGS. 25 and 26 are circuit diagrams respectively showing the structures of high voltage switch circuits 8A and 8B.

It is noted that the structure of the high voltage switch circuit to which the present invention is applied is not limited to that shown in FIG. 21. Another exemplary structure of the high voltage switch circuit is shown in FIG. 25. A high voltage switch circuit 8A shown in FIG. 25 includes transistors Q1n, Q2n, Q5n and Q6n, a voltage control circuit 20A including transistors Q3n, Q4n, Q7n and 8n, as well as an inverter IV2. Transistors Q7n and Q8n are PMOS transistors.

In high voltage switch circuit 8A, each of transistors Q3n, Q4n, Q7n and Q8n functions as a transistor for voltage control.

Transistor Q7n is connected between transistors Q1n and Q3n, whereas transistor Q8n is connected between transistors Q2n and Q4n. Each of transistors Q7n and Q8n has its gate receiving a ground voltage. Signal VOUT is output from a connection node (a node OUT) of transistors Q4n and Q8n.

Figure 26:
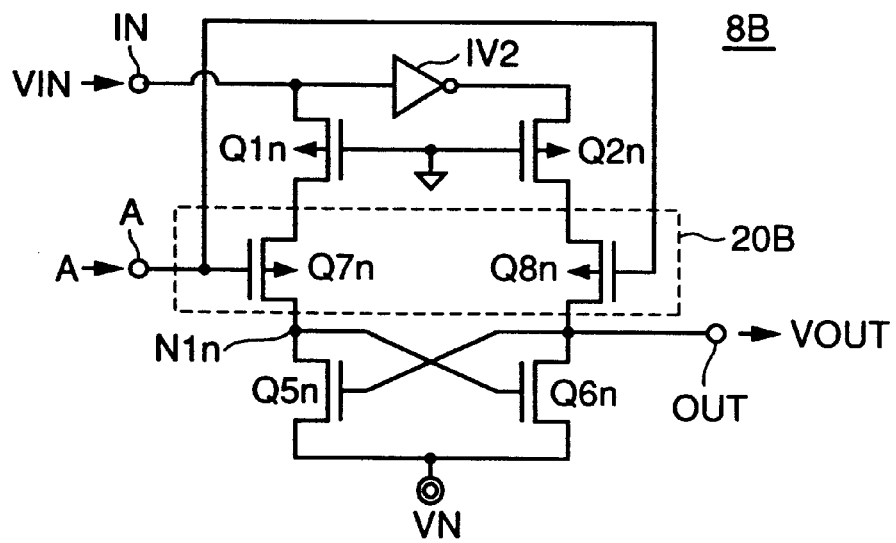

Another exemplary structure of the high voltage switch circuit is shown in FIG. 26. A high voltage switch circuit 8B shown in FIG. 26 includes transistors Q1n, Q2n, Q5n and Q6n, a voltage control circuit 20B including transistors, Q7n and Q8n, as well as an inverter IV2. In high voltage switch circuit 8B, each of transistors Q7n and Q8n functions as a transistor for voltage control.

Transistor Q7n is connected between transistors Qn1 and Q5n and have their gates receiving gate control signals A.

Transistor Q8n is connected between transistors Q2n and Q6n and has its gate receiving gate control signal A. A signal VOUT is output from a connection node (a node OUT) of transistors Q8n and Q6n.

It is noted that the control methods according to the first to the fifth embodiments and the seventh embodiment, which will next be described, may be applied to high voltage switch circuit 8.

Seventh Embodiment

Figure 27:
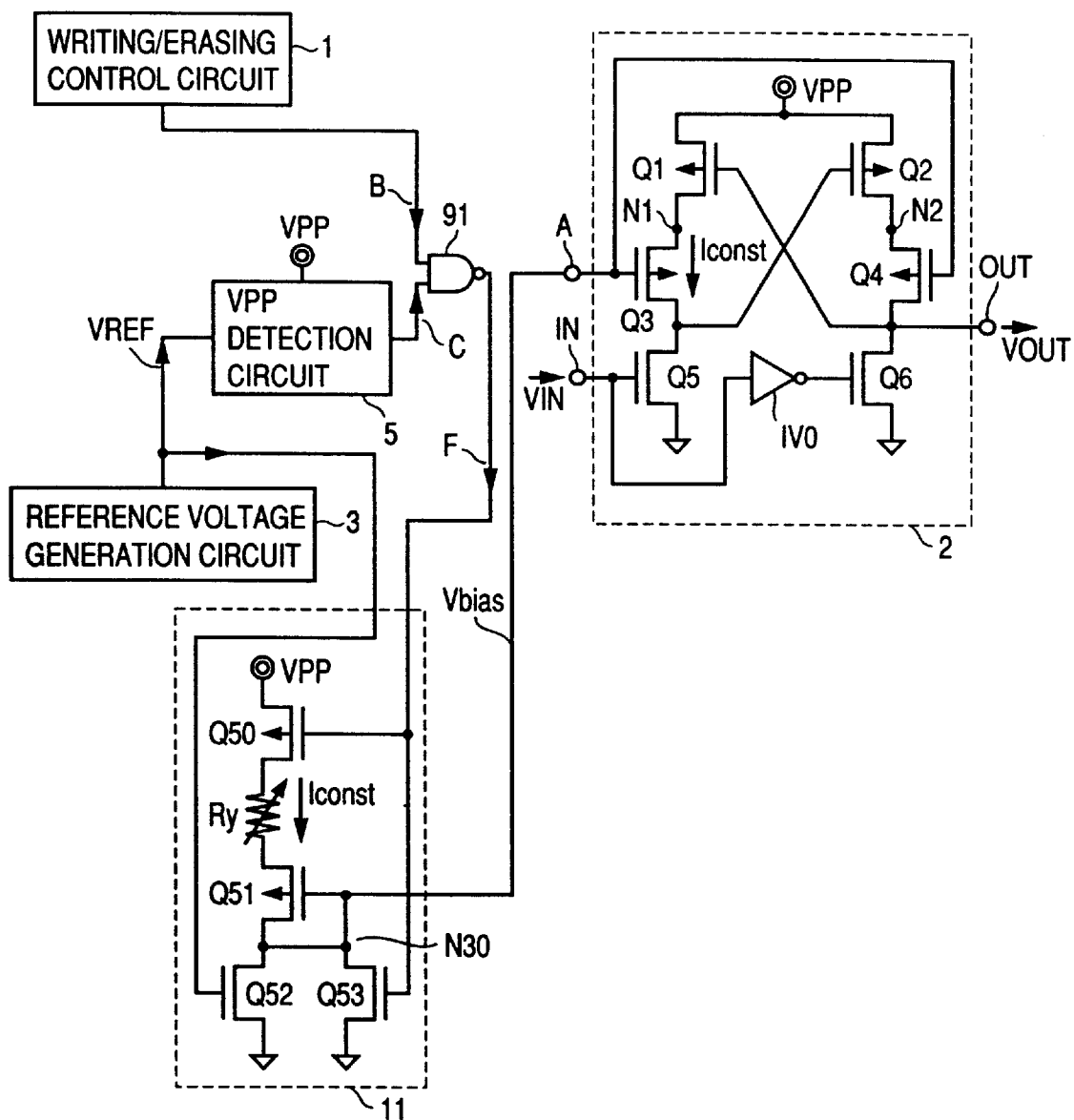
FIG. 27 is a diagram shown in conjunction with control of a high voltage switch circuit 2 according to the seventh embodiment.

A high voltage switch circuit according to the seventh embodiment will be described. In the seventh embodiment, as shown in FIG. 27, a high voltage switch circuit 2 includes transistors Q3 and Q4 having their gates receiving gate control signals A output from a bias voltage generation circuit 11.

Bias voltage generation circuit 11 will be described. As shown in FIG. 27, bias voltage generation circuit 11 includes a variable resister Ry and transistors Q50 to Q53. Transistors Q50 and Q51 are PMOS transistors, whereas transistors Q52 and Q53 are NMOS transistors.

Transistor Q50 is connected between a node VPP receiving a high voltage and one terminal of resister Ry, and has its gate receiving a control signal F output from an NAND circuit 91. Transistor Q51 is connected between the other terminal of variable resister Ry and a node N30, and has its gate connected to node N30.

Transistor Q52 is connected between node N30 and a node GND receiving a ground voltage GND, and has its gate receiving a reference voltage VREF output from reference voltage generation circuit 3. Transistor Q53 is connected between nodes N30 and GND, and has its gate receiving control signal F output from NAND circuit 91.

NAND circuit 91 receives control signal B output from writing/erasing control circuit 1 and a level detection signal C output from a VPP detection circuit 5 for outputting control signal F.

Gate control signal A (voltage Vbias) of node N30 is supplied to a control signal input node A of a high voltage switch circuit 8.

A constant bias current Iconst which is not dependent on a high voltage flows to resister Ry from node VPP. Similarly, a constant bias current Iconst flows to transistor Q3 by voltage Vbias.

When the above described structure is applied to semiconductor memory device 1000, outputs from high voltage generation circuit 10 would be supplied to nodes VPP of VPP detection circuit 5, bias voltage generation circuit 11, and a high voltage switch circuit 2.

Next, a control method for high voltage switch circuit 2 according to the seventh embodiment will be described. Bias voltage generation circuit 11 is controlled in accordance with control signal B output from writing/erasing control circuit 1 and level detection signal C output from VPP detection circuit 5. Gate control signal A attains to Vbias={VPP−(|Vthp|+Ry×Iconst)} from ground voltage level GND in accordance with the voltage level at node VPP.

It is noted that Vthp represents the threshold value of each of transistors Q50 and Q3.

Figure 28:
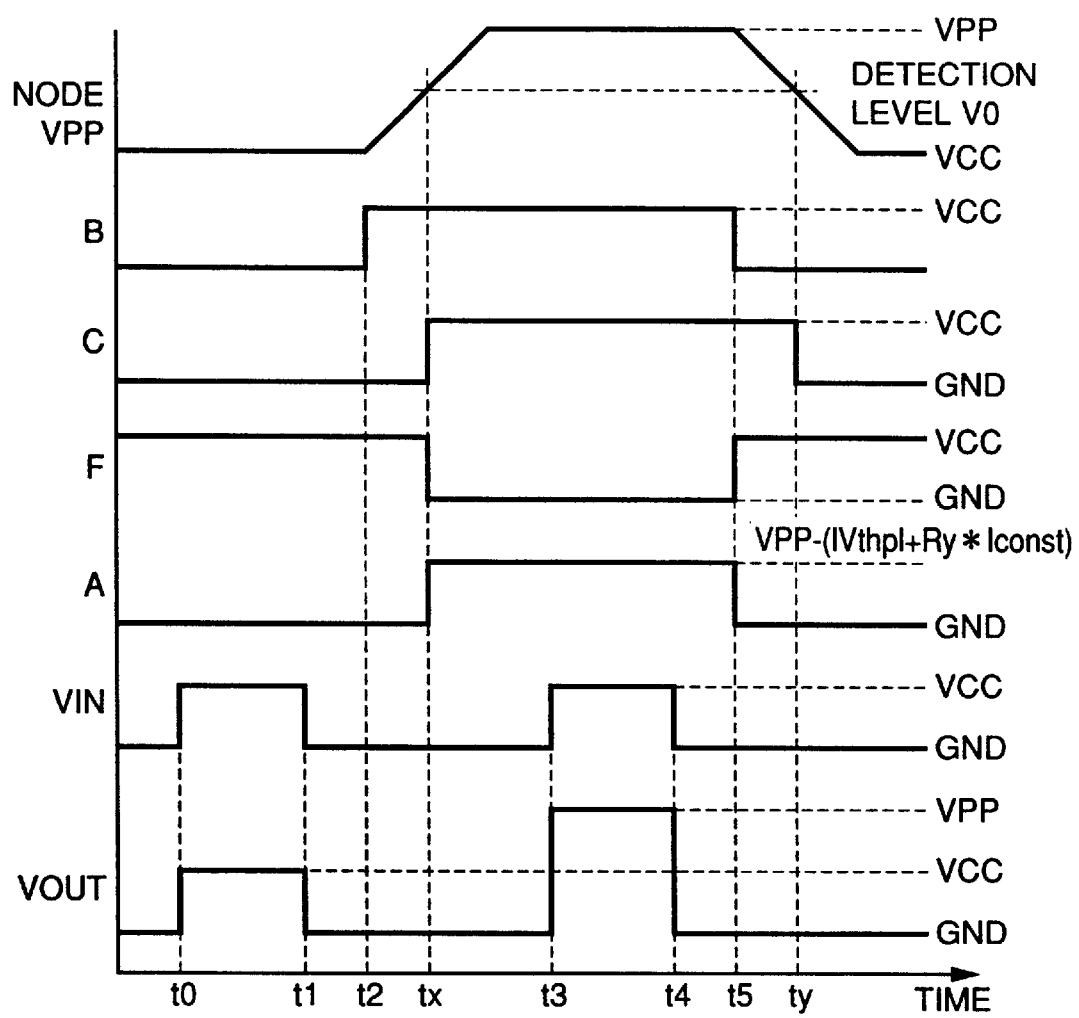
FIG. 28 is a timing chart shown in conjunction with a control method for high voltage switch circuit 2 according to the seventh embodiment.

Referring to FIG. 28, assume that high voltage switch circuit 2 receives power supply voltage level VCC between times t0 and t1 and between t3 and t4, but receives input signal VIN at ground voltage level GND otherwise. In addition, in an initial state, power supply voltage VCC is applied to node VPP.

When power supply voltage VCC is applied to node VPP (up to t2), control signal B is at ground voltage level GND. Thus, input signal VIN received between t0 and t1 is converted to signal VOUT at power supply voltage level VCC for output.

When application of the high voltage to node VPP is started (time t2), control signal B attains to power supply voltage level VCC from ground voltage level GND.

When the voltage applied to node VPP exceeds a prescribed detection level V0 (time tx), level detection signal C attains to power supply voltage level VCC from ground voltage level GND. Control signal F attains to ground voltage level GND from power supply voltage level VCC. Voltage Vbias applied to control signal input node A attains to {VPP−(|Vthp|+Ry×Iconst)} from ground voltage level GND.

Thus, voltage control is performed, and input signal VIN received between t3 and t4 is converted to signal VOUT at high voltage level VPP for output.

Then, when the level of the voltage applied to node VPP is decreased (when application of the high voltage is finished) (time t5), control signal B attains to ground voltage level GND from power supply voltage level VCC. Control signal F attains to power supply voltage level VCC from ground voltage level GND. Gate control signal A attains to ground voltage level GND.

Then, when the level of the voltage applied to node VPP falls below detection level V0 (time ty), level detection signal C attains to ground voltage level GND from power supply voltage level VCC.

Figure 29:
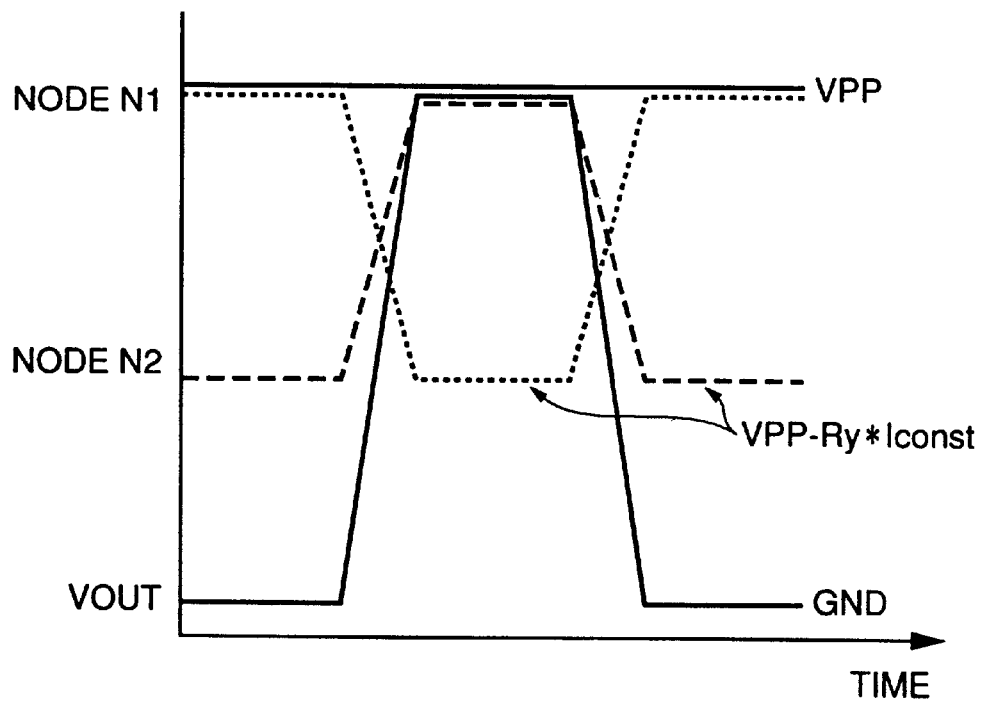
FIG. 29 is a timing chart shown in conjunction with voltage control in high voltage switch circuit 2 according to the seventh embodiment.

The above described control method allows the voltage levels of internal nodes N1 and N2 in high voltage switch circuit 2 to change as shown in FIG. 29 when switching the high voltage. Referring to FIG. 29, the source-drain voltages are controlled to (Ry×Iconst) and (VPP−Ry×Iconst) respectively for transistors Q1, Q2 and Q3, Q4.

When application of the high voltage to node VPP is finished or power supply voltage VCC is applied without application of the high voltage, the gate of the transistor for voltage control attains to ground voltage level GND from {VPP−(|Vthp|+Ry×Iconst)}, or is fixed at ground voltage level GND. Thus, even when the voltage applied to node VPP is low, a normal operation of high voltage switch circuit 2 is enabled.

It is noted that, by controlling the resistance value of the resistor in bias voltage generation circuit 11, the level of {VPP−(|Vthp|+Ry×Iconst)} can arbitrary be changed.

The control method as applied to semiconductor memory device 1000 will be described. When a high voltage is not required, writing/erasing control circuit 1 outputs control signal B at ground voltage level GND. At this point of time, high voltage generation circuit 106 is in an inactive state.

When a command CM designating a specific operation is input to writing/erasing control circuit 1, control signal B at power supply voltage level VCC is output from writing/erasing control circuit 1, so that voltage generation circuit 106 is activated. When the level of the output voltage of high voltage generation circuit 106 exceeds a detection level V0, gate control signal A input to the gate of the transistor for voltage control attains to a Vbias level.

When application of the high voltage is finished, control signal B attains to ground voltage level GND, and high voltage generation circuit 106 is inactivated. The level of the voltage applied to node VPP is decreased to attain to power supply voltage level VCC.

The above described control enables semiconductor memory device 1000 to perform a normal writing/erasing/reading operation. It is noted that a signal directly controlling activation/inactivation of high voltage generation circuit 106 may be used as control signal B.

It is noted that the method according to the seventh embodiment is not only applied to high voltage switch circuit 2, but is also applicable to the above described high voltage switch circuits 2A, 2B and the like. In addition, it may also be applied to a high voltage switch circuit converting input signal VIN to signal VOUT at amplitude level VN−VCC.

Eighth Embodiment

Figure 31:
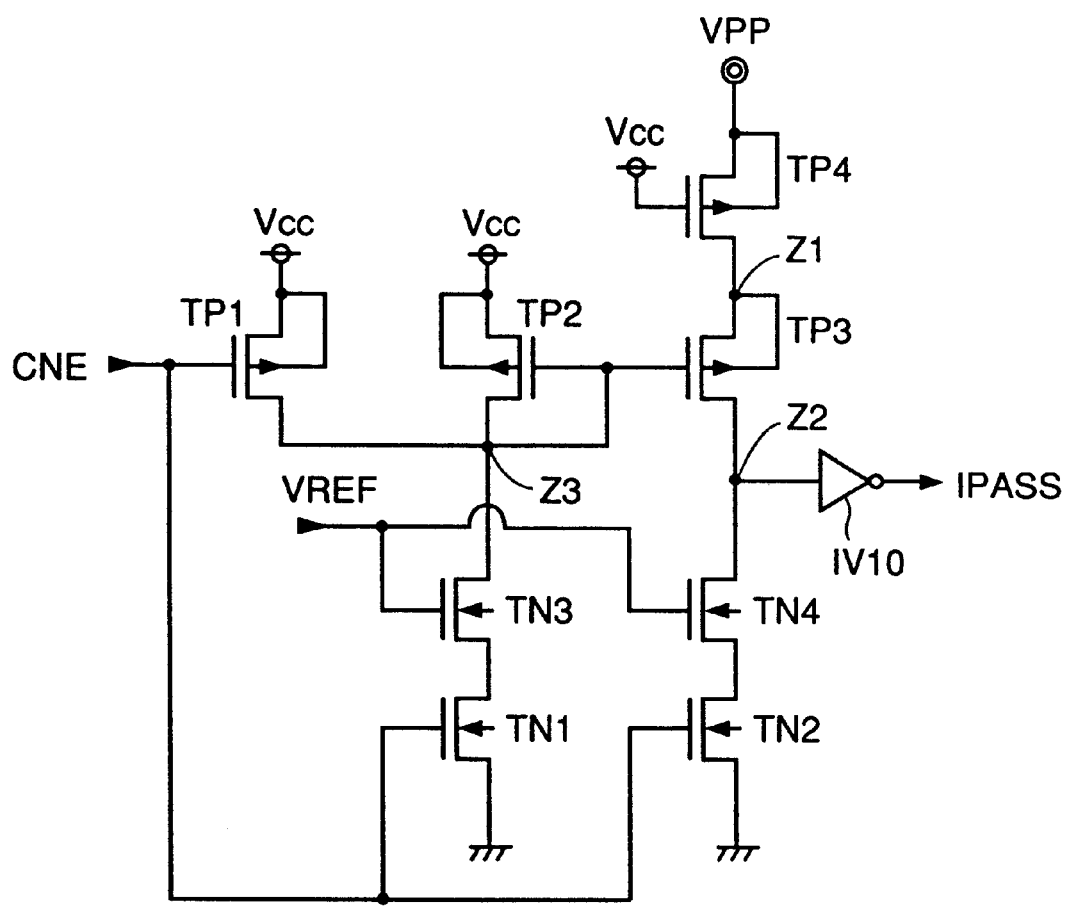
FIG. 31 is a circuit diagram showing the structures of a VPP detection circuit 5A according to the eighth embodiment.

In the eighth embodiment, another exemplary structure of a VPP detection circuit will be described. A VPP detection circuit 5A according to the eighth embodiment includes, as shown in FIG. 31, transistors TP1 to TP4, TN1 to TN4, and an inverter IN10. Transistors TP1 to TP4 are PMOS transistors, whereas transistors TN1 to TN4 are NMOS transistors.

Transistors TP1 and TP2 are connected between a node VCC receiving a power supply voltage VCC and a node Z3. Transistors TN3 and TN1 are connected in series between node Z3 and a node GND receiving a ground voltage GND.

Transistors TP1 and TN1 each receives at its gate an activation signal CNE for activating VPP detection circuit 5A, and transistor TN3 has its gate receiving a reference voltage VREF. Transistor TP2 has its gate connected to node Z3.

Transistor TP4 is connected between a node VPP receiving a high voltage VPP and a node Z1, whereas transistor TP3 is connected between nodes Z1 and Z2. Transistors TN4 and TN2 are connected in series between nodes GND and Z2.

Transistor TP4 has its gate connected to node VCC, whereas transistor TP3 has its gate connected to node Z3. Transistor TN4 has its gate receiving reference voltage VREF, and transistor TN2 has its gate receiving activation signal CNE.

Inverter IV10 inverts the signal of node Z2 for outputting a level detection signal IPASS.

The operation of VPP detection circuit 5A will now be described. When activation signal CNE attains to an H level, transistors TN1 and TN2 are turned on and transistor TP1 is turned off. In this state, VPP detection circuit 5A monitors the VPP level and, if the VPP level is high, brings level detection signal IPASS to an L level. On the other hand, if the VPP level is low, it brings level detection signal IPASS to the H level.

Transistors TN3 and TN4 having their gates receiving reference voltages VREF function as constant current sources.

Transistors TP2 and TP3 operate as a current mirror circuit. Transistor TP2 receives a current from transistor TN3. The current mirror circuit operates such that the same current flows through transistors TP2 and TP3.

On the other hand, a constant current also flows through transistor TN4, so that the currents from transistors TP3 and TN4 are the same. However, the potential at node Z1 must be at a power supply voltage level (VCC level) to obtain the same current for transistors TP3 and TN4.

When the potential at node Z1 is lower than the VCC level, the current flowing to transistor TP3 would be less than that flowing to transistor TN4. Thus, the voltage level at node Z2 decreases, and level detection signal IPASS attains to the H level.

Conversely, if the potential at node Z1 is higher than the VCC level, the current flowing to transistor TP3 would be more than that flowing to transistor TN4. Thus, the voltage level at node Z2 increases, and level detection signal IPASS attains to the L level.

The potential at node Z1 attains to the level higher than the VCC level when the potential at node VPP attains to the level at least VCC+|Vthp|. It is noted that Vthp represents a threshold value of transistor TP4.

As described above, according to VPP detection circuit 5A of the eighth embodiment, the voltage level of high voltage VPP can be detected. Thus, VPP detection circuit 5A is arranged in place of VPP detection circuit 5 for the high voltage switch circuit of each of the above described embodiments to produce an effect similar to that in the above described embodiments.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A high voltage switch circuit, comprising:
   a first power supply node capable of supplying a first voltage equal to or higher than a power supply voltage;
   a second power supply node supplying a second voltage lower than said power supply voltage;
   a first node formed between said first power supply node and said second power supply node;
   a voltage input node to which an input voltage is applied;
   a voltage output node supplying a high voltage formed by converting said input voltage;
   a control circuit supplying a voltage corresponding to the voltage at said first power supply node;
   a first transistor connected to said first power supply node and having a control electrode connected to said voltage output node;
   a second transistor connected between said first transistor and said first node and having a control electrode connected to an output of said control circuit;
   a third transistor connected between said first node and said second power supply node and having a control electrode connected to said voltage input node;
   a fourth transistor connected to said first power supply node and having a control electrode connected to said first node;
   a fifth transistor connected between said fourth transistor and said voltage output node and having a control electrode connected to the output of said control circuit; and
   a sixth transistor connected between said voltage output node and said second power supply node and having a control electrode receiving an inverted data of the input at said voltage input node.

2. The high voltage switch circuit according to claim 1, wherein the output voltage of said control circuit is controlled by a control signal at a voltage level less dependent on said power supply voltage.

3. The high voltage switch circuit according to claim 1, wherein the output voltage of said control circuit is controlled by a bias voltage allowing a constant current independent of said first voltage to flow.

4. The high voltage switch circuit according to claim 1, wherein the voltage at said first power supply node is said power supply voltage in a standby state, and attains to said first voltage after a first period of time is elapsed after said standby state, and
   the output voltage of said control circuit changes after a second period of time shorter than said first period of time is elapsed after the voltage at said first power supply node begins to change.

5. The high voltage switch circuit according to claim 1, wherein the output voltage of said control circuit changes when the voltage at said first power supply node attains to a prescribed level.

6. A high voltage switch circuit, comprising:
   a first power supply node capable of supplying a first voltage equal to or lower than a ground voltage;
   a voltage input node to which an input voltage higher than the ground voltage is applied;
   a first node formed between said first power supply node and said voltage input node;
   a voltage output node supplying a high voltage formed by converting said input voltage;
   a control circuit supplying a voltage corresponding to the voltage at said first power supply node;
   a first transistor connected to said first power supply node and having a control electrode connected to said voltage output node;
   a second transistor connected between said first transistor and said first node and having a control electrode connected to an output of said control circuit;
   a third transistor connected between said first node and said voltage input node and having a control electrode to which a constant voltage is applied;
   a fourth transistor connected to said first power supply node and having a control electrode connected to said first node;
   a fifth transistor connected between said fourth transistor and said voltage output node and having a control electrode connected to the output of said control circuit; and
   a sixth transistor connected between said voltage output node and said voltage input node and having a control electrode to which said constant voltage is applied.

7. The high voltage switch according to claim 6, wherein the voltage at said first power supply node is said ground voltage in a standby state, and attains to said first voltage after a first period of time is elapsed after said standby state, and
   the output voltage of said control circuit changes after a second period of time shorter than said first period of time is elapsed after the voltage at said first power supply node begins to change.

8. The high voltage switch circuit according to claim 6, wherein the output voltage of said control circuit changes when the voltage at said first power supply node attains to a prescribed level.

9. The high voltage switch circuit according to claim 6, wherein the output voltage of said control circuit is controlled by a control signal at a voltage level less dependent on said ground voltage.

10. The high voltage switch circuit according to claim 6, wherein the output voltage of said control circuit is controlled by a bias voltage allowing a constant current independent of said first voltage to flow.

11. The high voltage switch circuit according to claim 6, further comprising:
    a seventh transistor connected between said first node and said third transistor and having a control electrode connected to the output of said control circuit; and
    an eighth transistor connected between said voltage output node and said sixth transistor and having a control electrode connected to the output of said control circuit.

* * * * *